(12) United States Patent
Oguni et al.

(10) Patent No.: US 7,944,128 B2
(45) Date of Patent: May 17, 2011

(54) ELECTRONIC COMPONENT

(75) Inventors: Toshimi Oguni, Izumo (JP); Katsutomo Aritomi, Matsue (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/821,307

(22) Filed: Jun. 23, 2010

(65) Prior Publication Data

US 2011/0001399 A1    Jan. 6, 2011

(30) Foreign Application Priority Data

Jul. 1, 2009  (JP) ................... 2009-157147

(51) Int. Cl.
  *H01L 41/08*  (2006.01)
(52) U.S. Cl. ......................... 310/364; 310/366
(58) Field of Classification Search .................. 310/363, 310/364, 328, 344, 348, 366, 368
  See application file for complete search history.

(56) References Cited

U.S. PATENT DOCUMENTS

| | | | | |
|---|---|---|---|---|
| 3,113,223 A | * | 12/1963 | Smith et al. | 310/329 |
| 4,485,325 A | * | 11/1984 | Yamamoto et al. | 310/344 |
| 5,128,581 A | * | 7/1992 | Nakayama et al. | 310/329 |
| 5,388,459 A | * | 2/1995 | Inoue et al. | 73/514.34 |
| 6,043,588 A | * | 3/2000 | Tabota et al. | 310/329 |

FOREIGN PATENT DOCUMENTS

| | | |
|---|---|---|
| JP | 63-77327 U | 5/1988 |
| JP | 2002-158137 A | 5/2002 |
| JP | 2002-203737 A | 7/2002 |
| JP | 2002-217054 A | 8/2002 |
| JP | 2006-60147 A | 3/2006 |

* cited by examiner

*Primary Examiner* — Mark Budd
(74) *Attorney, Agent, or Firm* — Keating & Bennett, LLP

(57) ABSTRACT

An electronic component includes an electronic component body, first and second outer electrodes, and first and second inner electrodes. The first outer electrode includes a first conductive layer that does not include silver and a second conductive layer that is deposited on the first conductive layer so as to be positioned at an outermost layer and that includes silver. The second conductive layer includes a first contact portion in contact with a first main surface and is not in contact with first and second side surfaces. A first inner conductor is provided on a virtual straight or substantially straight line connecting a second inner electrode closest to the first contact portion and the first contact portion in the shortest distance. The first inner conductor is connected only to the first outer electrode or is connected to none of the first and second outer electrodes.

8 Claims, 21 Drawing Sheets

ELECTRONIC COMPONENT

BACKGROUND OF THE INVENTION

1. Field of the Invention

The present invention relates to electronic components and, more particularly, to an electronic component including inner electrodes and outer electrodes including silver (Ag).

2. Description of the Related Art

Many electronic components, such as ceramic electronic components, are mounted on a wiring board installed in an electronic device. Although solder including lead (Pb) is generally used in the mounting of such electronic components on a wiring board in related art, an attempt to mount electronic components without using Pb is presently being pursued in order to reduce environmental loads.

For example, methods of mounting electronic components using conductive adhesive in which conductive fine particles, such as metallic filler, are added to thermosetting resin, such as thermosetting epoxy resin, or Pb-free solder are commonly used in order to mount the electronic components without using Pb. Various electronic components to which the above methods are preferably applicable are disclosed in, for example, Japanese Unexamined Patent Application Publication No. 2002-158137 and Japanese Unexamined Patent Application Publication No. 2002-203737.

As an electronic component that can be preferably mounted using Pb-free solder, Japanese Unexamined Patent Application Publication No. 2002-158137 discloses a multilayer ceramic electronic component in which outer electrodes are formed at both ends of a multilayer ceramic body including inner electrodes made of nickel (Ni) or a Ni alloy. In the multilayer ceramic electronic component, each outer electrode is a multilayer body in which base electrode layers primarily including copper (Cu) or a Cu alloy and outermost electrode layers primarily including Ag or an Ag alloy are laminated.

The electronic component using the electrode layers including Ag as the outermost electrode layers in the outer electrodes, as the one disclosed in Japanese Unexamined Patent Application Publication No. 2002-158137, is also preferably mounted using conductive adhesive. The use of the electrode layers including Ag as the outermost electrode layers in the outer electrodes allows the affinity between the outer electrodes and the conducive adhesive to be improved, thus increasing the mounting strength of the electronic component.

However, short circuit failure between the outer electrodes can be caused due to migration of Ag in the multilayer ceramic electronic component disclosed in Japanese Unexamined Patent Application Publication No. 2002-158137. In particular, when the multilayer ceramic electronic component disclosed in Japanese Unexamined Patent Application Publication No. 2002-158137 is used in a high temperature atmosphere of, for example, about 150° C. or greater, as in a case in which the multilayer ceramic electronic component is used in or near an engine control unit (ECU) in an automobile, the short circuit failure due to the migration of Ag is likely to occur.

SUMMARY OF THE INVENTION

To overcome the problems described above, preferred embodiments of the present invention provide an electronic component which is capable of being mounted by using conductive adhesive and in which short circuit failure is prevented.

A first electronic component according to a preferred embodiment of the present invention includes an electronic component body having a substantially rectangular parallelepiped shape, a first outer electrode, a second outer electrode, a first inner electrode, and a second inner electrode. The electronic component body includes first and second main surfaces extending along a lateral direction and a longitudinal direction, first and second side surfaces extending along the longitudinal direction and a vertical direction, and first and second end surfaces extending along the lateral direction and the vertical direction. The first outer electrode is arranged so that the first end surface, a portion of the first main surface, and a portion of the first and second side surfaces are covered with the first outer electrode. The second outer electrode is arranged on the second end surface. The first inner electrode is arranged in the electronic component body and is connected to the first outer electrode. The second inner electrode is arranged in the electronic component body and is connected to the second outer electrode. The first outer electrode includes a first conductive layer and a second conductive layer. The first conductive layer is arranged so that the first end surface, a portion of the first main surface, and a portion of the first and second side surfaces are covered with the first conductive layer and does not include silver. The second conductive layer is deposited on the first conductive layer so as to be positioned at an outermost layer and includes silver. The second conductive layer includes a first contact portion that is in contact with the first main surface and the second conductive layer is not in contact with the first and second side surfaces. Among the first and second inner electrodes, the inner electrode closest to the first contact portion is the second inner electrode, and the first electronic component further includes a first inner conductor positioned on a virtual straight or substantially straight line connecting the second inner electrode and the first contact portion in the shortest distance. The first inner conductor is connected only to the first outer electrode, among the first and second outer electrodes, or is connected to none of the first and second outer electrodes.

The second outer electrode may preferably be arranged so that the second end surface, a portion of the first main surface, and a portion of the first and second side surfaces are covered with the second outer electrode. The second outer electrode may preferably include a first conductive layer that is arranged so that the second end surface, a portion of the first main surface, and a portion of the first and second side surfaces are covered with the first conductive layer and that does not include silver and a second conductive layer that is deposited on the first conductive layer so as to be positioned at an outermost layer and that includes silver. The second conductive layer of the second outer electrode may preferably include a second contact portion that is in contact with the first main surface and may not be in contact with the first and second side surfaces. A second inner conductor may preferably be provided on a virtual straight or substantially straight line connecting the first inner electrode closest to the second contact portion and the second contact portion in the shortest distance or the second inner electrode may preferably be positioned on the virtual straight or substantially straight line connecting the first inner electrode closest to the second contact portion and the second contact portion in the shortest distance. The second inner conductor may preferably be connected only to the second outer electrode, among the first and second outer electrodes, or may preferably be connected to none of the first and second outer electrodes. With this structure, the migration of silver from the second contact portion can be effectively prevented. As a result, it is possible to effectively prevent an occurrence of short circuit failure between the first and second outer electrodes.

A portion of the first conductive layer, positioned on the first and second side surfaces, may not be covered with the second conductive layer. With this structure, since the migration of silver from the second conductive layer can be more effectively prevented, it is possible to more effectively prevent an occurrence of the short circuit failure.

Only at least a portion of the first conductive layer, positioned on the first side surface, may be covered with the second conductive layer and only at least a portion of the first conductive layer, positioned on the second side surface, may be covered with the second conductive layer. A tip in the longitudinal direction is preferably not included in each of the portions of the first conductive layer. With this structure, since the migration of silver from the second conductive layer can be more effectively prevented, it is possible to more effectively prevent an occurrence of the short circuit failure.

A plurality of first inner conductors may preferably be provided. With this structure, since the migration of silver from the first contact portion can be more effectively prevented, it is possible to more effectively prevent an occurrence of the short circuit failure.

An electronic component according to another preferred embodiment of the present invention includes an electronic component body having a substantially rectangular parallelepiped shape, a first outer electrode, a second outer electrode, a first inner electrode, and a second inner electrode. The electronic component body includes first and second main surfaces extending along a lateral direction and a longitudinal direction, first and second side surfaces extending along the longitudinal direction and a vertical direction, and first and second end surfaces extending along the lateral direction and the vertical direction. The first outer electrode is arranged so that the first end surface, portion of the first main surface, and a portion of the first and second side surfaces are covered with the first outer electrode. The second outer electrode is arranged so that the second end surface, a portion of the first main surface, and a portion of the first and second side surfaces are covered with the second outer electrode. The first inner electrode is arranged in the electronic component body and is connected to the first outer electrode. The second inner electrode is arranged in the electronic component body and is connected to the second outer electrode. Each of the first and second outer electrodes includes a first conductive layer and a second conductive layer. The first conductive layer of the first outer electrode is arranged so that the first end surface, a portion of the first main surface, and a portion of the first and second side surfaces are covered with the first conductive layer and does not include silver. The first conductive layer of the second outer electrode is arranged so that the second end surface, a portion of the first main surface, and a portion of the first and second side surfaces are covered with the first conductive layer and does not include silver. The second conductive layer is deposited on the first conductive layer so as to be positioned at an outermost layer and includes silver. The second conductive layer of the first outer electrode and the second conductive layer of the second outer electrode are positioned only on the first conductive layer and are not directly in contact with the first and second main surfaces and the first and second side surfaces.

The second conductive layer may preferably include silver or a silver-palladium alloy, for example, as a major component. This structure further facilitates mounting using conductive adhesive.

The electronic component body may preferably be made of ceramics, for example.

Since the outermost layer of each of the first and second outer electrodes includes the second conductive layer including silver in the first and second electronic components according to preferred embodiments of the present invention, it is easy to perform mounting using conductive adhesive.

In addition, in the first and second electronic components according to preferred embodiments of the present invention, the first inner conductor is preferably arranged so as to be positioned on the virtual straight or substantially straight line connecting the second inner electrode closest to the first contact portion, among the first and second inner electrodes, and the first contact portion in the shortest distance and the first inner conductor is connected only to the first outer electrode, among the first and second outer electrodes, or is preferably connected to none of the first and second outer electrodes. Accordingly, the migration of silver from the first contact portion is effectively prevented and, therefore, the short circuit failure is prevented.

Furthermore, the second conductive layer is preferably positioned only on the first conductive layer and is not directly in contact with the first and second main surfaces and the first and second side surfaces in the first and second electronic components according to preferred embodiments of the present invention. Accordingly, the migration of silver from the second conductive layer is effectively prevented and, therefore, the short circuit failure is prevented.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will herein be described with reference to the attached drawings.

First Preferred Embodiment

Figure 1:
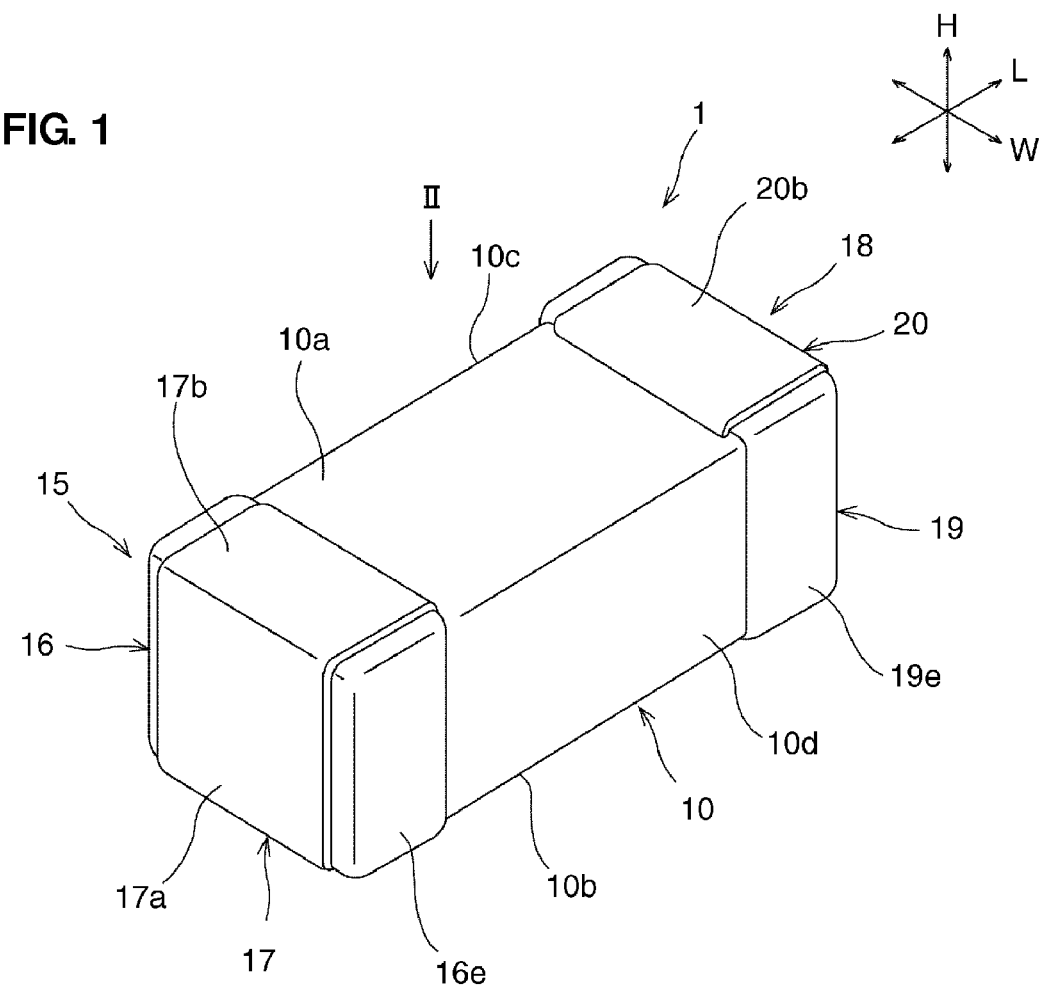
FIG. 1 is a schematic perspective view of an electronic component according to a first preferred embodiment of the present invention.
Figure 2:
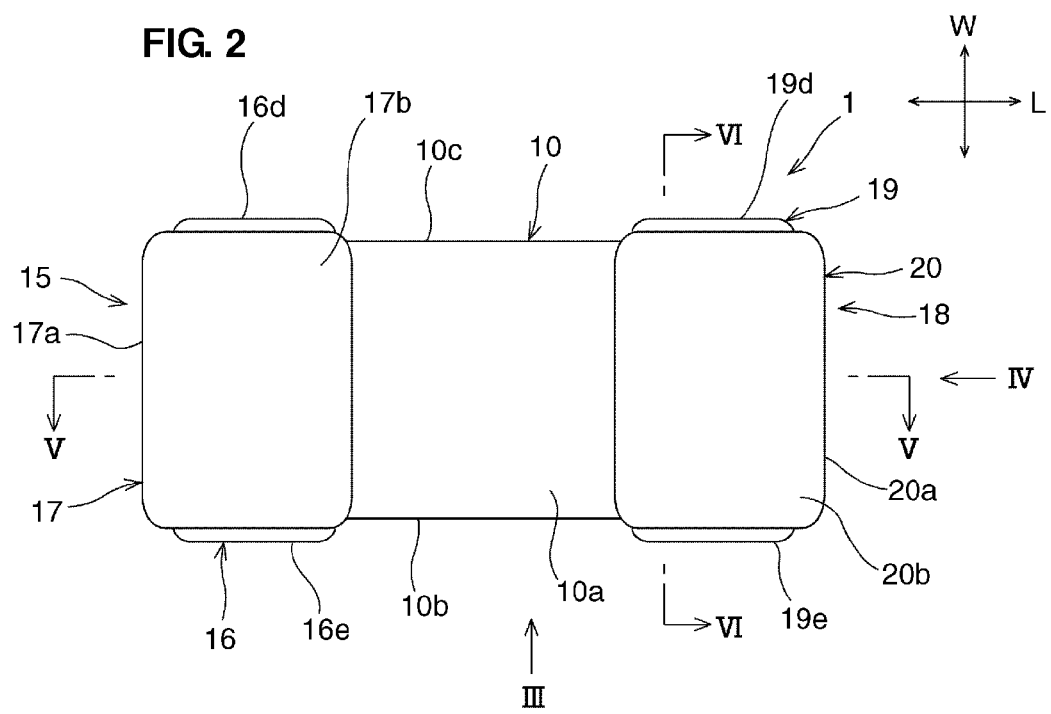
FIG. 2 is a schematic plan view of the electronic component according to the first preferred embodiment of the present invention.
Figure 3:
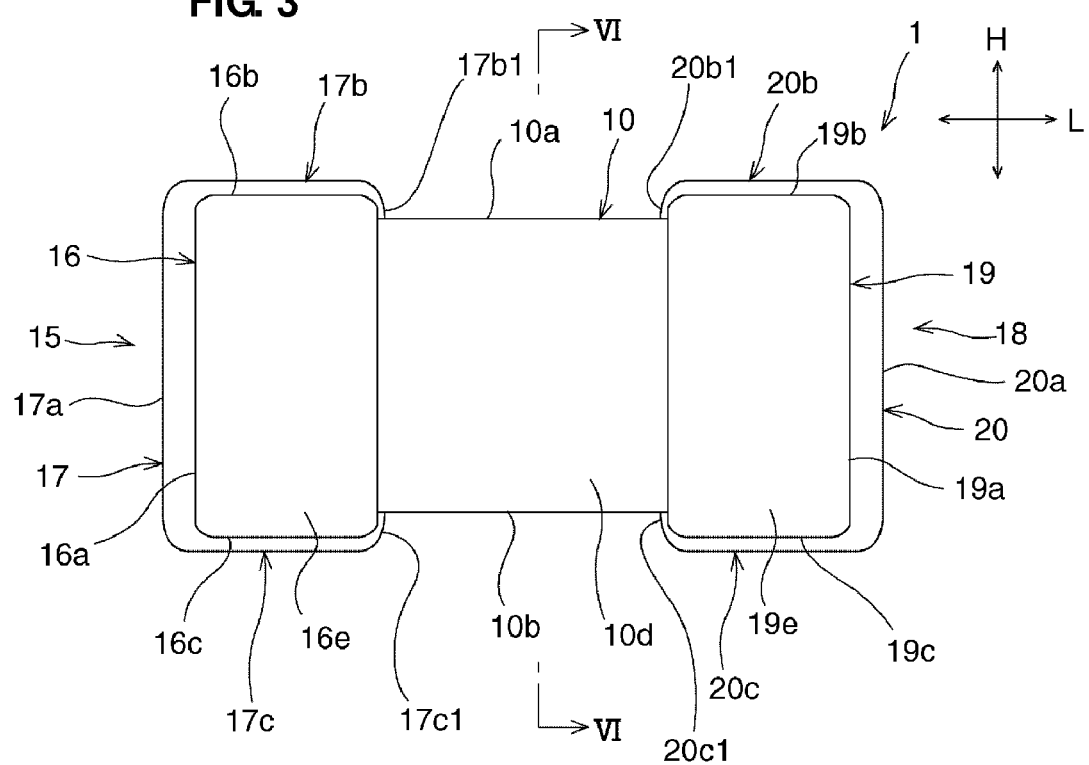
FIG. 3 is a schematic side view of the electronic component, viewed from an arrow III in FIG. 2.
Figure 4:
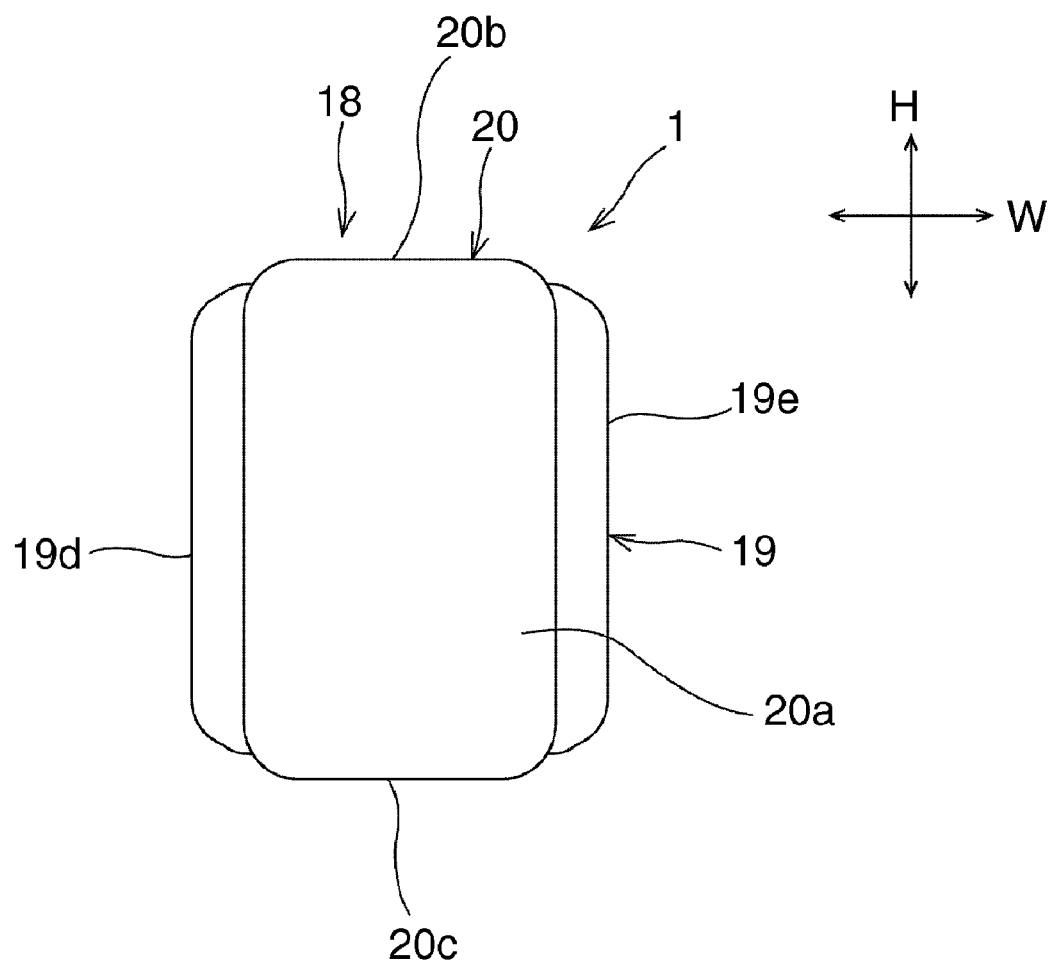
FIG. 4 is a schematic front view of the electronic component, viewed from an arrow IV in FIG. 2.
Figure 5:
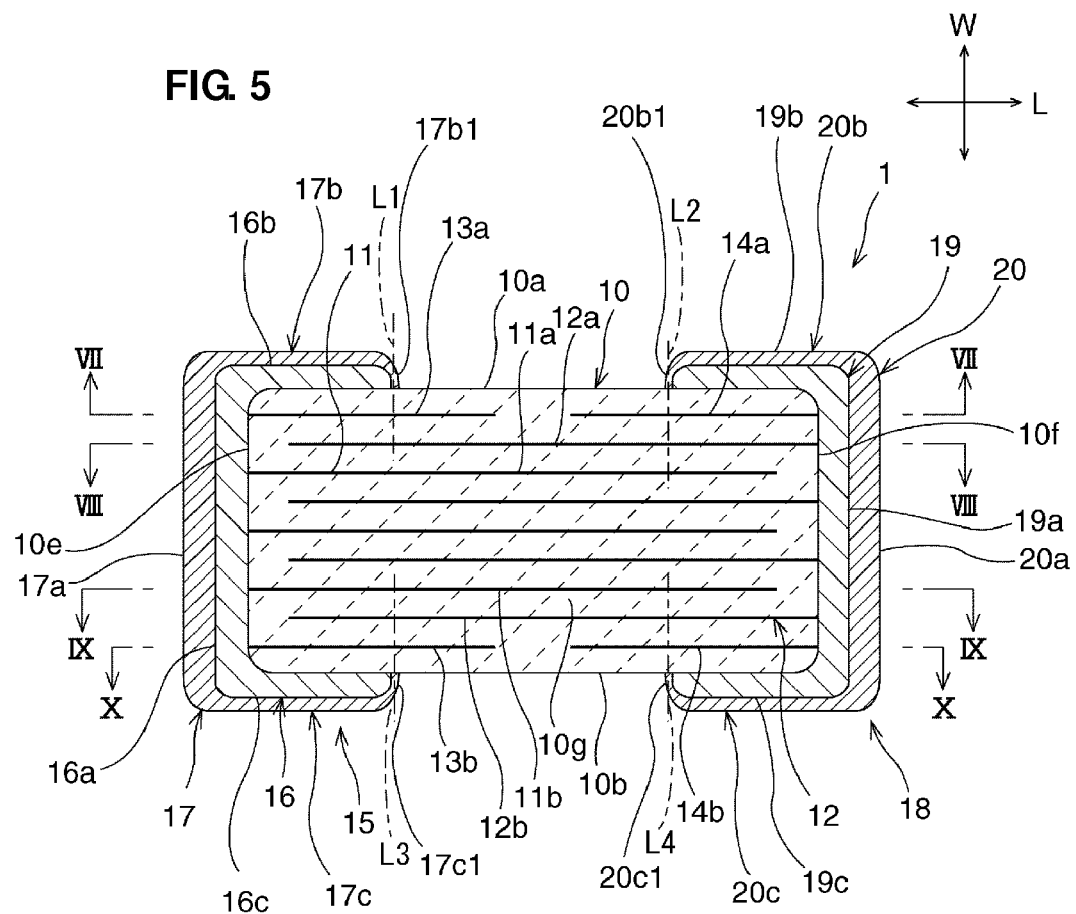
FIG. 5 is a schematic cross-sectional view of the electronic component, taken along a line V-V in FIG. 2.
Figure 6:
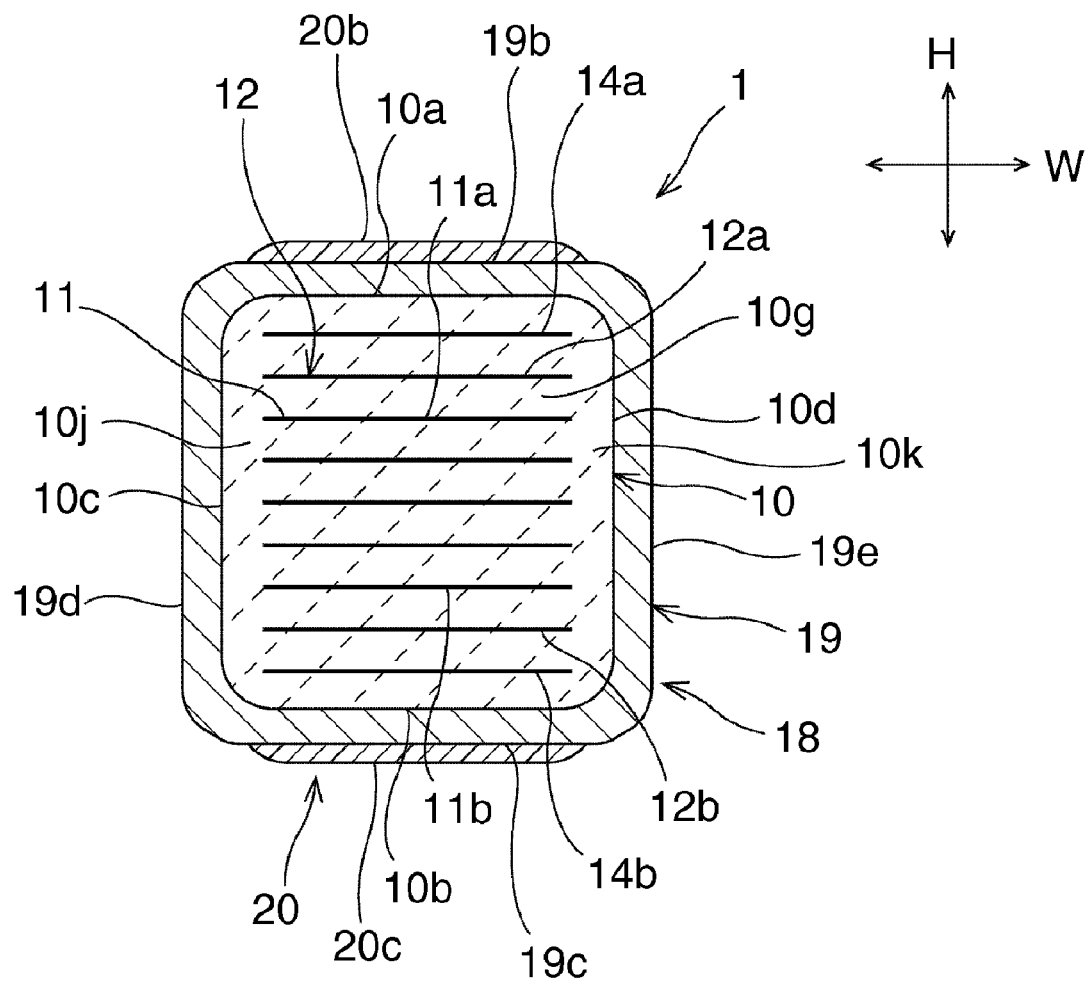
FIG. 6 is a schematic cross-sectional view of the electronic component, taken along a line VI-VI in FIG. 3.
Figure 7:
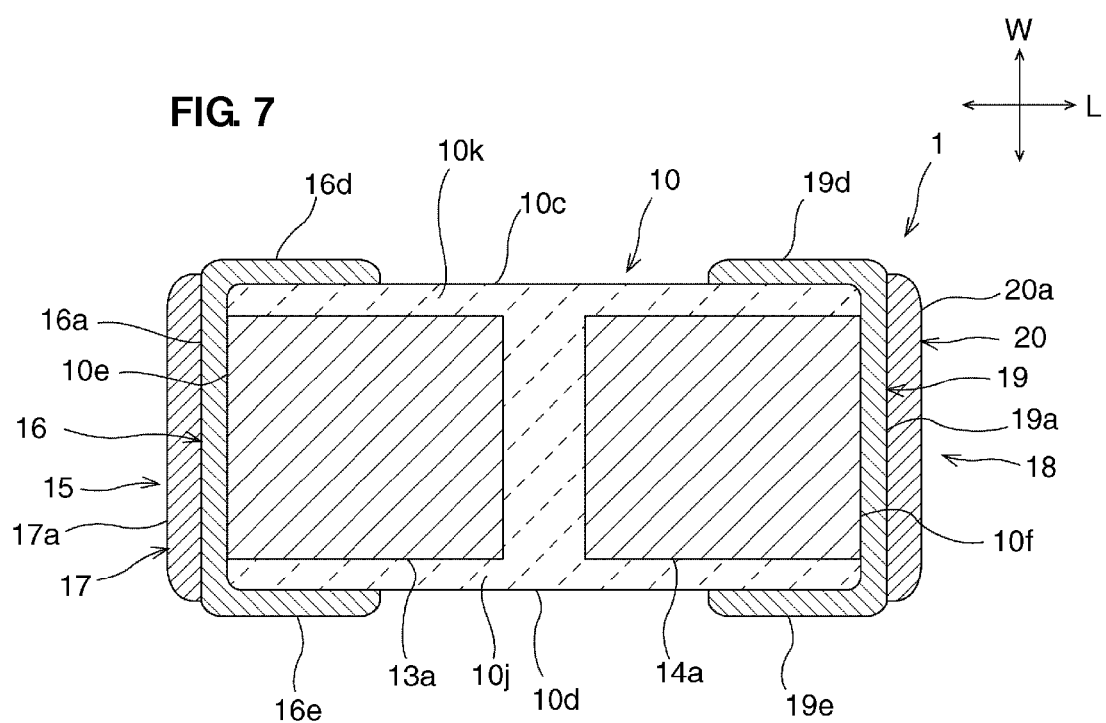
FIG. 7 is a schematic cross-sectional view of the electronic component, taken along a line VII-VII in FIG. 5.
Figure 8:
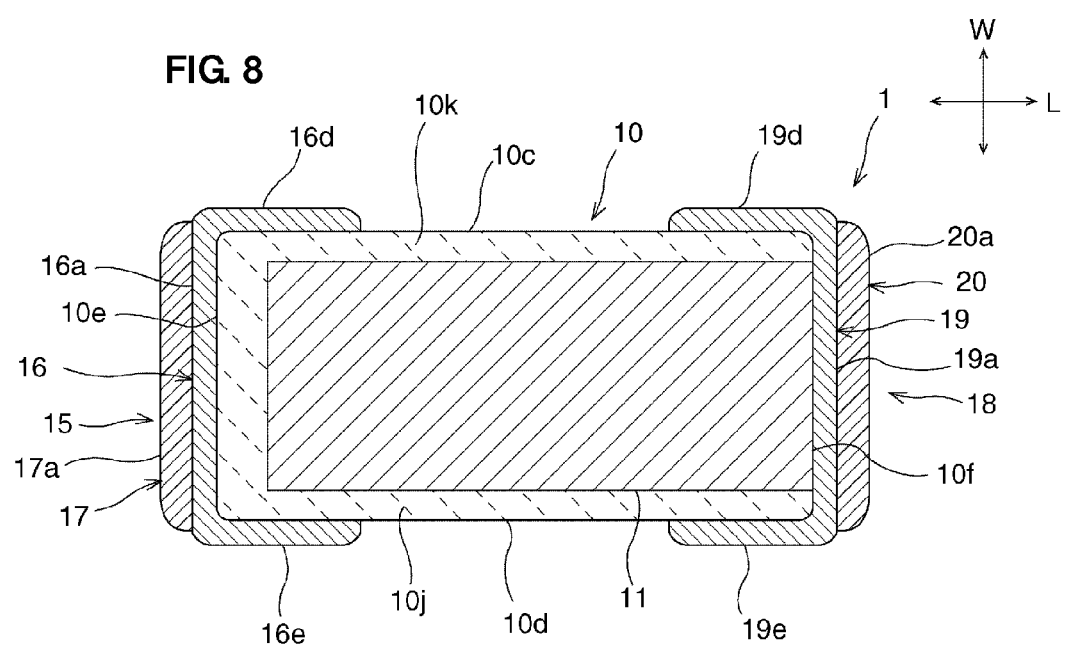
FIG. 8 is a schematic cross-sectional view of the electronic component, taken along a line VIII-VIII in FIG. 5.
Figure 9:
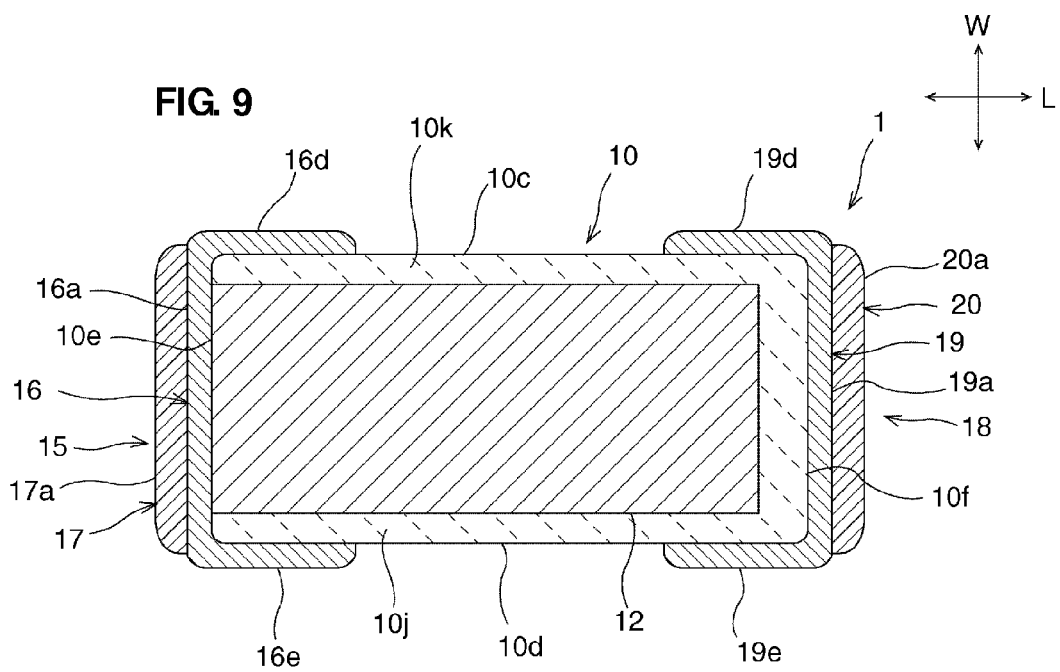
FIG. 9 is a schematic cross-sectional view of the electronic component, taken along a line IX-IX in FIG. 5.
Figure 10:
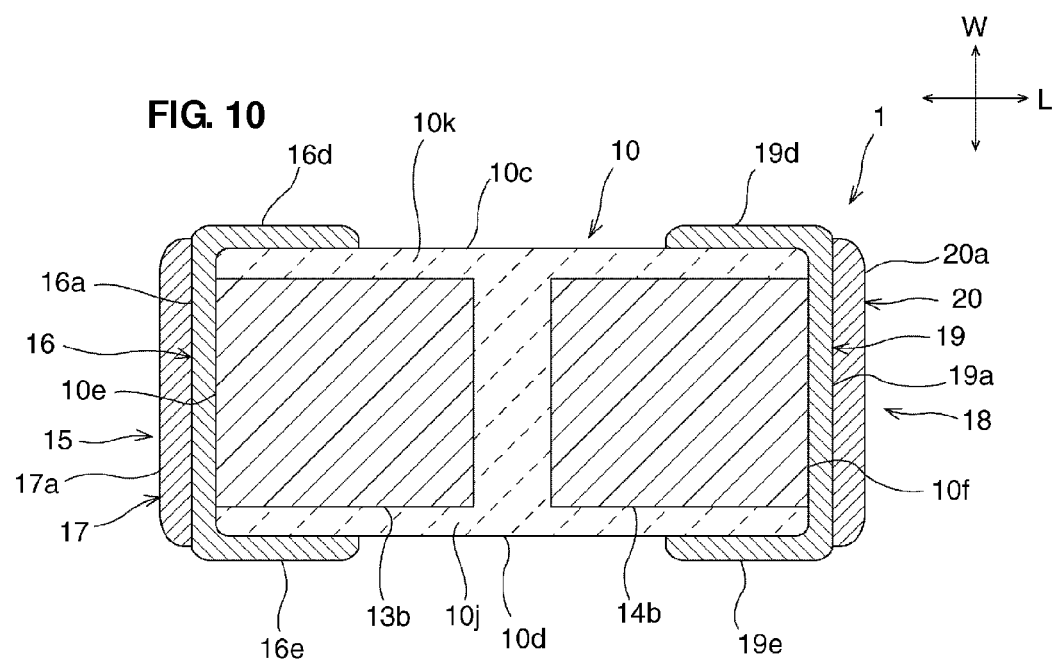
FIG. 10 is a schematic cross-sectional view of the electronic component, taken along a line X-X in FIG. 5.

FIG. 1 is a schematic perspective view of an electronic component according to a first preferred embodiment of the present invention. FIG. 2 is a schematic plan view of the electronic component according to the first preferred embodiment of the present invention. FIG. 3 is a schematic side view of the electronic component according to the first preferred embodiment of the present invention, viewed from an arrow III in FIG. 2. FIG. 4 is a schematic front view of the electronic component, according to the first preferred embodiment of the present invention viewed from an arrow IV in FIG. 2. FIG. 5 is a schematic cross-sectional view of the electronic component, taken along a line V-V in FIG. 2. FIG. 6 is a schematic cross-sectional view of the electronic component, taken along a line VI-VI in FIG. 3. FIG. 7 is a schematic cross-sectional view of the electronic component, taken along a line VII-VII in FIG. 5. FIG. 8 is a schematic cross-sectional view of the electronic component, taken along a line VIII-VIII in FIG. 5. FIG. 9 is a schematic cross-sectional view of the electronic component, taken along a line IX-IX in FIG. 5. FIG. 10 is a schematic cross-sectional view of the electronic component, taken along a line X-X in FIG. 5.

As shown in FIGS. 1 to 3, an electronic component 1 includes a substantially rectangular parallelepiped electronic component body 10. As shown in FIG. 3, the electronic component body 10 includes a first main surface 10a and a second main surface 10b extending along a longitudinal direction L and a lateral direction W. As shown in FIG. 2, the electronic component body 10 includes a first side surface 10c and a second side surface 10d extending along a vertical direction H and the longitudinal direction L. As shown in FIG. 5, the electronic component body 10 includes a first end surface 10e and a second end surface 10f extending along the vertical direction H and the lateral direction W.

The "substantially rectangular parallelepiped" includes a rectangular parallelepiped in which corners or edge lines are chamfered or chamfered into circular arc shapes in this specification. Specifically, the "substantially rectangular parallelepiped" members mean all of the members having the first and second main surfaces, the first and second side surfaces, and the first and second end surfaces. For example, ridges or valleys may be formed on portions or all of the main surfaces, the side surfaces, and the end surfaces.

The dimensions of the electronic component body 10 are not specifically limited. For example, the electronic component body 10 preferably has a height of about 0.5 mm to about 2.5 mm, a length of about 1.0 mm to about 3.2 mm, and a width of about 0.5 mm to about 2.5 mm.

The electronic component body 10 is not specifically limited as long as the electronic component body 10 is made of a material having an insulating capacity of a certain level or greater. According to the first preferred embodiment, the electronic component body 10 is preferably made of ceramics. Specifically, the electronic component body 10 is preferably composed of a ceramic multilayer body in which multiple ceramic layers are laminated in the vertical direction H. Accordingly, the electronic component 1 of the first preferred embodiment is specifically a multilayer ceramic electronic component.

The type of the ceramics of which the electronic component body 10 is made is not specifically limited and can be appropriately selected depending on desired features of the electronic component 1.

For example, when the electronic component 1 is a capacitor, the electronic component body 10 may preferably be made of dielectric ceramics. The dielectric ceramic is preferably, for example, $BaTiO_3$, $CaTiO_3$, $SrTiO_3$, or $CaZrO_3$. In addition to the dielectric ceramics, an additional component, such as a manganese (Mn) compound, an iron (Fe) compound, a chromium (Cr) compound, a cobalt (Co) compound, or a Ni compound, for example, may be appropriately added to the electronic component body 10 depending on desired features of the electronic component 1.

For example, when the electronic component 1 is a ceramic piezoelectric element, the electronic component body 10 may be made of piezoelectric ceramics. The piezoelectric ceramics is preferably, for example, lead zirconate titanate (PZT) ceramics.

For example, when the electronic component 1 is a thermistor element, the electronic component body 10 may be made of semiconductor ceramics. The semiconductor ceramics is preferably, for example, spinel ceramics.

For example, when the electronic component 1 is an inductance element, the electronic component body 10 may be made of magnetic ceramics. The magnetic ceramics is preferably, for example, ferrite ceramics.

As shown in FIGS. 5 and 6, the electronic component body 10 includes multiple first inner electrodes 11 and multiple second inner electrodes 12. The first inner electrodes 11 and the second inner electrodes 12 each have a substantially rectangular shape and are alternately arranged in the electronic component body 10 at equal or substantially equal intervals in the vertical direction H. The first inner electrodes 11 and the second inner electrodes 12 are parallel or substantially parallel to the first main surface 10a and the second main surface 10b. The first inner electrodes 11 are opposed to the second inner electrodes 12 in the vertical direction H via ceramic layers 10g. The thickness of each of the ceramic layers 10g is not specifically limited. For example, each of the ceramic layers 10g may have a thickness of about 0.5 µm to about 10 µm.

The thickness of each of the first inner electrodes 11 and the second inner electrodes 12 is not specifically limited. For example, each of the first inner electrodes 11 and the second inner electrodes 12 may have a thickness of about 0.3 µm to about 2.0 µm.

Each of the first inner electrodes 11 and the second inner electrodes 12 is exposed only on either of the first end surface 10e and the second end surface 10f. Specifically, the first inner electrodes 11 are exposed on the first end surface 10e, as shown in FIGS. 5 and 9. The first inner electrodes 11 are not exposed on the second end surface 10f, the first and second main surfaces 10a and 10b, and the first and second side surfaces 10c and 10d, as shown in FIGS. 6 and 9.

The second inner electrodes 12 are exposed on the second end surface 10f, as shown in FIGS. 5 and 8. The second inner electrodes 12 are not exposed on the first end surface 10e, the first and second main surfaces 10a and 10b, and the first and second side surfaces 10c and 10d, as shown in FIGS. 6 and 8.

Accordingly, as shown in FIGS. 6, 8, and 9, gaps 10j and 10k in which the first inner electrodes 11 and the second inner electrodes 12 are not arranged are formed at both ends of the electronic component body 10 in the lateral direction W. The dimensions of the gaps 10j and 10k along the lateral direction W are not specifically limited. For example, each of the gaps 10j and 10k may have a dimension of about 30 µm to about 300 µm along the lateral direction W.

Each of the first inner electrodes 11 and the second inner electrodes 12 includes an appropriate conductive material as the major component. Each of the first inner electrodes 11 and the second inner electrodes 12 preferably includes at least one kind of, for example, metals Ni, Cu, Ag, palladium (Pd), and gold (Au), for example. Each of the first inner electrodes 11 and the second inner electrodes 12 may be made of, for example, an Ag—Pd alloy.

As shown in FIG. 1, the electronic component 1 includes a first outer electrode 15 and a second outer electrode 18. The first outer electrode 15 is connected to the first inner electrodes 11, as shown in FIGS. 5 and 9. In contrast, the second outer electrode 18 is connected to the second inner electrodes 12, as shown in FIGS. 5 and 8.

As shown in FIGS. 1 to 5 and FIGS. 8 and 9, the first outer electrode 15 is preferably arranged so as to extend from the first end surface 10e to the first and second main surfaces 10a and 10b and the first and second side surfaces 10c and 10d, and the second outer electrode 18 is arranged so as to extend from the second end surface 10f to the first and second main surfaces 10a and 10b and the first and second side surfaces 10c and 10d. Specifically, the first outer electrode 15 is arranged so that the first end surface 10e, a portion of the first and second main surfaces 10a and 10b, and a portion of the first and second side surfaces 10c and 10d are covered with the first outer electrode 15. The second outer electrode 18 is arranged so that the second end surface 10f, a portion of the first and second main surfaces 10a and 10b, and a portion of the first and second side surfaces 10c and 10d are covered with the second outer electrode 18.

As shown in FIG. 5, at least a portion of the first inner electrodes 11 and the second inner electrodes 12 is overlapped with at least a portion of the portion of the first outer electrode 15, which is on the first and second main surfaces 10a and 10b, in the vertical direction H. At least a portion of the first inner electrodes 11 and the second inner electrodes 12 is overlapped with at least a portion of the portion of the second outer electrode 18, which is on the first and second main surfaces 10a and 10b, in the vertical direction H.

The first outer electrode 15 is defined by a multilayer body including a first conductive layer 16 and a second conductive layer 17, and the second outer electrode 18 is defined by a multilayer body including a first conductive layer 19 and a second conductive layer 20. Specifically, according to the first preferred embodiment, the first outer electrode 15 is defined by a multilayer body of the first conductive layer 16 and the second conductive layer 17, and the second outer electrode 18 is defined by a multilayer body of the first conductive layer 19 and the second conductive layer 20.

The first conductive layers 16 and 19 are disposed immediately above the surface of the electronic component body 10. Specifically, the first conductive layers 16 and 19 are arranged so as to be in contact with the electronic component body 10. The first conductive layer 16 is arranged so as to extend from the first end surface 10e to the first and second main surfaces 10a and 10b and the first and second side surfaces 10c and 10d, and the first conductive layer 19 is arranged so as to extend from the second end surface 10f to the first and second main surfaces 10b and the first and second side surfaced 10d.

Specifically, as shown in FIGS. 1 to 5, the first conductive layer 16 including a portion of the first outer electrode 15 includes a first portion 16a with which the first end surface 10e is covered, a second portion 16b with which a portion of the first main surface 10a is covered, a third portion 16c with which a portion of the second main surface 10b is covered, a fourth portion 16d with which a portion of the first side surface 10c is covered, and a fifth portion 16e with which a portion of the second side surface 10d is covered. The first conductive layer 19 including a portion of the second outer electrode 18 includes a first portion 19a with which the second end surface 10f is covered, a second portion 19b with which a portion of the first main surface 10a is covered, a third portion 19c with which a portion of the second main surface 10b is covered, a fourth portion 19d with which a portion of the first side surface 10c is covered, and a fifth portion 19e with which a portion of the second side surface 10d is covered.

As shown in FIG. 5, the second conductive layer 17 includes the outermost layer of the first outer electrode 15 and the second conductive layer 20 includes the outermost layer of the second outer electrode 18. In other words, the second conductive layer 17 is deposited on the first conductive layer 16 so as to be positioned at the outermost layer, and the second conductive layer 20 is deposited on the first conductive layer 19 so as to be positioned at the outermost layer. A plating layer is not formed on each of the second conductive layers 17 and 20.

According to the first preferred embodiment, the second conductive layer 17 preferably is provided only on the first end surface 10e and the first and second main surfaces 10a and 10b and is not provided on the first and second side surfaces 10c and 10d, and the second conductive layer 20 is provided only on the second end surface 10f and the first and second main surfaces 10a and 10b and is not provided on the first and second side surfaces 10c and 10d. Accordingly, the second conductive layers 17 and 20 are not directly in contact with the first and second side surfaces 10c and 10d.

Specifically, the second conductive layer 17 including a portion of the first outer electrode 15 includes a first portion 17a with which the first portion 16a of the first conductive layer 16 is covered, a second portion 17b with which the second portion 16b is covered, and a third portion 17c with which the third portion 16c is covered. The second conductive layer 20 including a portion of the second outer electrode 18 includes a first portion 20a with which the first portion 19a of the first conductive layer 19 is covered, a second portion 20b with which the second portion 19b is covered, and a third portion 20c with which the third portion 19c is covered.

As shown in FIGS. 3 and 5, the tip of the second portion 17b of the second conductive layer 17 and the tip of the second portion 20b of the second conductive layer 20 are in contact with the first main surface 10a. The tip of the third portion 17c of the second conductive layer 17 and the tip of the third portion 20c of the second conductive layer 20 are in contact with the second main surface 10b. Specifically, the tip of the second portion 17b of the second conductive layer 17 includes a first contact portion 17b1 that is directly in contact with the first main surface 10a. The tip of the second portion 20b of the second conductive layer 20 includes a second contact portion 20b1 that is directly in contact with the first main surface 10a. The tip of the third portion 17c of the second conductive layer 17 includes a third contact portion 17c1 that is directly in contact with the second main surface 10b. The tip of the third portion 20c of the second conductive layer 20 includes a fourth contact portion 20c1 that is directly in contact with the second main surface 10b.

The first conductive layers 16 and 19 preferably do not include Ag. "Does not include Ag" means does not substantially include Ag and is not limited to a case in which the content of Ag is 0% by weight. Specifically, the "does not include Ag" means that the content of Ag is not higher than about 0.1% by weight in the entire component including the first conductive layers 16 and 19.

The conductive material including the first conductive layers 16 and 19 is not specifically limited. For example, a noble metal such as Ag or Pd, a base metal such as Cu or Ni, or an alloy including at least one type of these metals as the major component may be used as the conductive material composing the first conductive layers 16 and 19. When the first inner electrodes 11 and the second inner electrodes 12 include a base metal such as Ni, the first conductive layers 16 and 19 preferably include a base metal such as Ni so as to improve the connection reliability between the first outer electrode 15 and the first inner electrodes 11 and between the second outer electrode 18 and the second inner electrodes 12. A component such as glass, for example, may be added to the first conductive layers 16 and 19, in addition to the conductive material. The conductive material preferably comprises about 80% by weight or greater, for example, in the entire component composing the first conductive layers 16 and 19.

In contrast, the second conductive layers 17 and 20 preferably include Ag. The conductive material including the second conductive layers 17 and 20 preferably includes Ag or an Ag—Pd alloy, for example, as the major component, and the second conductive layers 17 and 20 are more preferably substantially composed of only Ag or an Ag—Pd alloy, for example. The conductive material including the second conductive layers 17 and 20 may include a noble metal such as Au, other than Ag, or a base metal such as Cu, for example. Ag preferably comprises about 50% by weight or greater, for example, in the conductive material composing the second conductive layers 17 and 20. A component such as glass, for example, may be added to the second conductive layers 17 and 20, in addition to the conductive material. The conductive material preferably comprises about 80% by weight or greater, for example, in the entire component composing the second conductive layers 17 and 20.

The thickness of each of the first conductive layers 16 and 19 and the second conductive layers 17 and 20 is not specifically limited. Each of the first conductive layers 16 and 19 and the second conductive layers 17 and 20 may preferably have a thickness of, for example, about 10 µm to about 50 µm.

As shown in FIG. 5, according to the first preferred embodiment, the electronic component body 10 includes first to fourth inner conductors 13a, 14a, 13b, and 14b formed therein. The first inner conductor 13a is arranged between the first contact portion 17b1 of the second portion 17b of the second conductive layer 17 and the second inner electrodes 12. The second inner conductor 14a is arranged between the second contact portion 20b1 of the second portion 20b of the second conductive layer 20 and the first inner electrodes 11. The third inner conductor 13b is arranged between the third contact portion 17c1 of the third portion 17c of the second conductive layer 17 and the second inner electrodes 12. The fourth inner conductor 14b is arranged between the fourth contact portion 20c1 of the third portion 20c of the second conductive layer 20 and the first inner electrodes 11.

Specifically, the first inner conductor 13a is positioned between a second inner electrode 12a and the first contact portion 17b1 on a virtual straight or substantially straight line L1 connecting the second inner electrode 12a and the first contact portion 17b1 in the shortest distance. The second inner electrode 12a is positioned so as to be closest to the first contact portion 17b1, among the first inner electrodes 11 and the second inner electrodes 12. The first inner conductor 13a is connected to the first outer electrode 15. As shown in FIG. 7, the first inner conductor 13a preferably has a substantially rectangular shape and extends from the first end surface 10e toward the second end surface 10f. The first inner conductor 13a is arranged over the second inner electrode 12a in the lateral direction W. In other words, the entire second inner electrode 12a is covered with the first inner conductor 13a in the lateral direction W. The width of the first inner conductor 13a may be greater than that of the second inner electrode 12a.

As shown in FIG. 5, the second inner conductor 14a is positioned between a first inner electrode 11a and the second contact portion 20b1 on a virtual straight or substantially straight line L2 connecting the first inner electrode 11a and the second contact portion 20b1 in the shortest distance. The first inner electrode 11a is positioned so as to be closest to the second contact portion 20b1, among the first inner electrodes 11 and the second inner electrodes 12. The second inner conductor 14a is connected to the second outer electrode 18. As shown in FIG. 7, the second inner conductor 14a preferably has a substantially rectangular shape and extends from the second end surface 10f toward the first end surface 10e. As shown in FIG. 6, the second inner conductor 14a is arranged over the first inner electrode 11a in the lateral direction W. In other words, the entire first inner electrode 11a is covered with the second inner conductor 14a in the lateral direction W. The width of the second inner conductor 14a may be greater than that of the first inner electrode 11a.

Although the second inner conductor 14a and the first inner conductor 13a are preferably arranged at the same position in the vertical direction H, the second inner conductor 14a may be formed at a position different from that of the first inner conductor 13a in the vertical direction H.

As shown in FIG. 5, the third inner conductor 13b is positioned between a second inner electrode 12b and the third contact portion 17c1 on a virtual straight or substantially straight line L3 connecting the second inner electrode 12b and the third contact portion 17c1 in the shortest distance. The second inner electrode 12b is positioned so as to be closest to the third contact portion 17c1, among the first inner electrodes 11 and the second inner electrodes 12. The third inner conductor 13b is connected to the first outer electrode 15. As shown in FIG. 10, the third inner conductor 13b preferably has a substantially rectangular shape and extends from the first end surface 10e toward the second end surface 10f. The third inner conductor 13b is arranged over the second inner electrode 12b in the lateral direction W. In other words, the entire second inner electrode 12b is covered with the third inner conductor 13b in the lateral direction W. The width of the third inner conductor 13b may be greater than that of the second inner electrode 12b.

As shown in FIG. 5, the fourth inner conductor 14b is positioned between a first inner electrode 11b and the fourth contact portion 20c1 on a virtual straight or substantially straight line L4 connecting the first inner electrode 11b and the fourth contact portion 20c1 in the shortest distance. The first inner electrode 11b is positioned so as to be closest to the fourth contact portion 20c1, among the first inner electrodes 11 and the second inner electrodes 12. The fourth inner conductor 14b is connected to the second outer electrode 18. As shown in FIG. 10, the fourth inner conductor 14b has a substantially rectangular shape and extends from the second end surface 10f toward the first end surface 10e. As shown in FIG. 6, the fourth inner conductor 14b is arranged over the first inner electrode 11b in the lateral direction W. In other words, the entire first inner electrode 11b is covered with the fourth inner conductor 14b in the lateral direction W. The width of the fourth inner conductor 14b may be greater than that of the first inner electrode 11b.

Although the fourth inner conductor 14b and the third inner conductor 13b are preferably arranged at the same position in the vertical direction H, the fourth inner conductor 14b may be formed at a position different from that of the third inner conductor 13b in the vertical direction H.

The first to fourth inner conductors 13a, 14a, 13b, and 14b include an appropriate conductive material as the major component, similar the first inner electrodes 11 and the second inner electrodes 12. Each of the first to fourth inner conductors 13a, 14a, 13b, and 14b preferably includes at least one kind of, for example, metals Ni, Cu, Ag, Pd, and Au as the major component. Each of the first to fourth inner conductors 13a, 14a, 13b, and 14b may be made of, for example, an Ag—Pd alloy.

The thickness of each of the first to fourth inner conductors 13a, 14a, 13b, and 14b is not specifically limited. Each of the first to fourth inner conductors 13a, 14a, 13b, and 14b may preferably have a thickness of, for example, about 0.3 µm to about 2.0 µm.

As described above, according to the first preferred embodiment, the second conductive layers 17 and 20 including the outermost layers of the respective first and second outer electrodes 15 and 18 preferably include Ag. Accordingly, the electronic component 1 of the first preferred embodiment can be mounted by using the conductive adhesive. In particular, since the second conductive layers 17 and 20 include Ag or an Ag—Pd alloy, for example, as the major component in the first preferred embodiment, the electronic component 1 of the first preferred embodiment is more preferably mounted using the conductive adhesive.

When the second conductive layer 17 including Ag is directly in contact with the surface of the electronic component body 10 as in the first preferred embodiment, Ag can migrate from the second conductive layer 17 to the electronic component body 10 to cause short circuit between the first outer electrode 15 and the second outer electrode 18. In particular, when the second conductive layer 17 includes Ag or an Ag—Pd alloy, for example, as the major component, the migration of Ag is likely to occur and, therefore, the short circuit failure is more likely to occur.

In order to resolve this problem, according to the first preferred embodiment, the first inner conductor 13a connected to the first outer electrode 15 is arranged between the first contact portion 17b1 and the second inner electrode 12a and the third inner conductor 13b connected to the first outer electrode 15 is arranged between the third contact portion 17c1 and the second inner electrode 12b. Accordingly, it is possible to suppress the concentration of the electric field in the first contact portion 17b1 and the third contact portion 17c1 including Ag, thus preventing the migration of Ag from the first contact portion 17b1 and the third contact portion 17c1 of the second conductive layer 17. Similarly, the second inner conductor 14a connected to the second outer electrode 18 is arranged between the second contact portion 20b1 and the first inner electrode 11a and the fourth inner conductor 14b connected to the second outer electrode 18 is arranged between the fourth contact portion 20c1 and the first inner electrode 11b. Accordingly, the migration of Ag from the second contact portion 20b1 and the fourth contact portion 20c1 of the second conductive layer 20 is prevented. Consequently, it is possible to effectively prevent an occurrence of the short circuit failure due to an occurrence of the migration of Ag.

In addition, the second conductive layers 17 are not disposed on the first and second side surfaces 10c and 10d and are not directly in contact with the first and second side surfaces 10c and 10d in the first preferred embodiment. Accordingly, the migration of Ag from the portions of the first outer electrode 15 and the second outer electrode 18, which are on the first and second side surfaces 10c and 10d, is prevented. Consequently, it is possible to more effectively prevent an occurrence of the short circuit failure due to an occurrence of the migration of Ag.

Inner conductors may preferably be provided in the gaps 10j and 10k to prevent an occurrence of the migration of Ag. However, it is necessary to provide the inner conductors along the vertical direction H and the longitudinal direction L in this case. In other words, it is necessary to provide the inner conductors extending in a direction perpendicular to the ceramic layers 10g. Accordingly, it is difficult to manufacture the multilayer ceramic electronic component. In contrast, the prevention of the occurrence of the migration of Ag by not forming the second conductive layers 17 and 20 on the first and second side surfaces 10c and 10d, as in the first preferred embodiment, eliminates the need to provide the inner conductors along the vertical direction H and the longitudinal direction L, thus facilitating the manufacture of the electronic component 1.

To prevent the occurrence of the migration of Ag from the second conductive layers 17 and 20, the second conductive layer 17 may not be formed on the second portion 16b and the third portion 16c of the first conductive layer 16 and the second conductive layer 20 may not be formed on the second portion 19b and the third portion 19c of the first conductive layer 19. Alternatively, the first contact portion 17b1 and the second contact portion 20b1 may not be in contact with the first main surface 10a and the third contact portion 17c1 and the fourth contact portion 20c1 may not be in contact with the second main surface 10b. However, in such cases, there is no portion in which the second conductive layers 17 and 20 are directly in contact with the electronic component body 10. Accordingly, the second conductive layers 17 and 20 are likely to peel off when an external force is applied to the second conductive layers 17 and 20. In order to solve this problem, according to the first preferred embodiment, the first contact portion 17b1 and the second contact portion 20b1 are directly in contact with the first main surface 10a and the third contact portion 17c1 and the fourth contact portion 20c1 are directly in contact with the second main surface 10b. Accordingly, the fixing strength of the second conductive layers 17 and 20 to the electronic component body 10 can be increased. Consequently, it is possible to effectively prevent the peeling off of the second conductive layers 17 and 20 from the electronic component body 10.

The electric field tends to concentrate between the first contact portion 17b1 and second contact portion 20b1 and between the third contact portion 17c1 and the fourth contact portion 20c1 with the decreasing distance between the first contact portion 17b1 and the second contact portion 20b1 and between the third contact portion 17c1 and the fourth contact portion 20c1. Accordingly, it is preferable that the first contact portion 17b1 is spaced apart from the second contact portion 20b1 and the third contact portion 17c1 be spaced apart from the fourth contact portion 20c1 without significantly reducing the fixing strength of the second conductive layers 17 and 20 to the electronic component body 10. Specifically, the distance between the first contact portion 17b1 and the second contact portion 20b1 and the distance between the third contact portion 17c1 and the fourth contact portion 20c1 is preferably at least about 0.5 times greater, for example, than the length of the electronic component 1.

A method of manufacturing the electronic component 1 according to the first preferred embodiment is not specifically limited. For example, the electronic component 1 may be manufactured in the following manner.

First, ceramic green sheets, conductive paste for formation of the inner electrodes, paste for formation of the inner conductors, and conductive paste for formation of the outer electrodes are prepared. The conductive paste for formation of the inner electrodes may preferably be the same as the paste for formation of the inner conductors, for example. The ceramic green sheets and the conductive pastes each include binder and solvent. Known binder and solvent, for example, may preferably be used here. The conductive paste for formation of the outer electrodes may preferably include glass, for example.

Next, the conductive paste for formation of the inner electrodes and the paste for formation of the inner conductors are applied on the ceramic green sheets by a known printing method, such as screen printing, for example, to form an inner electrode pattern and an inner conductor pattern.

Next, multiple ceramic green sheets on which the inner electrode pattern and the inner conductor pattern are not formed are laminated, and the ceramic green sheet on which the inner conductor pattern is formed, the ceramic green sheet on which the inner electrode pattern is formed, the ceramic green sheet on which the inner conductor pattern is formed, and the ceramic green sheet on which the inner electrode pattern and the inner conductor pattern are not formed are sequentially laminated to form a raw mother multilayer body. The mother multilayer body may be pressed in the layering direction by, for example, isostatic pressing, if necessary, to attach the laminated ceramic green sheets by pressure.

Next, the raw mother multilayer body is cut into a desired size to form a raw ceramic multilayer body. The raw ceramic multilayer body may be subjected to, for example, barrel polishing, if necessary, to chamfer the corners and/or the edge lines or chamfer the corners and/or the edge line into circular arc shapes.

Next, the raw ceramic multilayer body is fired. The firing temperature is appropriately set depending on the type of the ceramic that is used. The raw ceramic multilayer body may be fired at, for example, about 900° C. to about 1,300° C. The atmosphere provided for the firing may be an air atmosphere, nitrogen gas atmosphere, or nitrogen gas atmosphere including water vapor, for example.

Next, conductive paste is applied to the end surfaces of the ceramic multilayer body subjected to the firing and the ceramic multilayer body to which the conductive paste is applied is baked to form the first conductive layers and the second conductive layers in order to complete the electronic component 1. The baking temperature may be set to, for example, about 700° C. to about 900° C.

Figure 11:
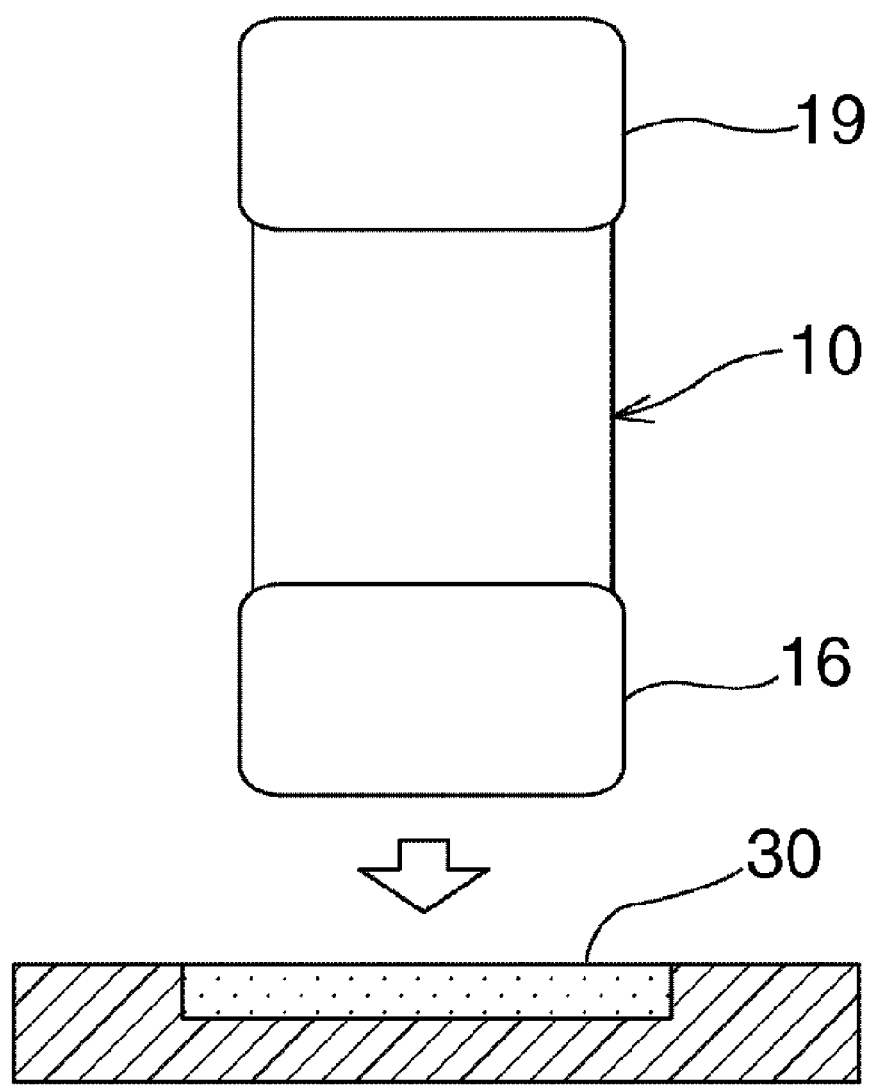
FIG. 11 is a schematic view showing a process of forming a first portion of a second conductive layer.
Figure 12:
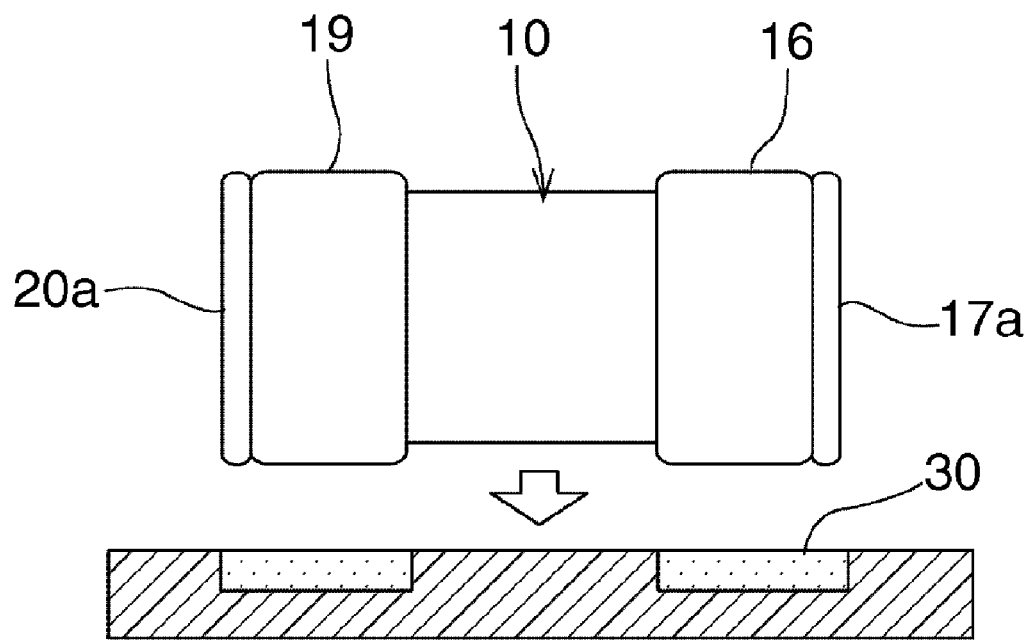
FIG. 12 is a schematic view showing a process of forming a second portion of the second conductive layer.
Figure 13:
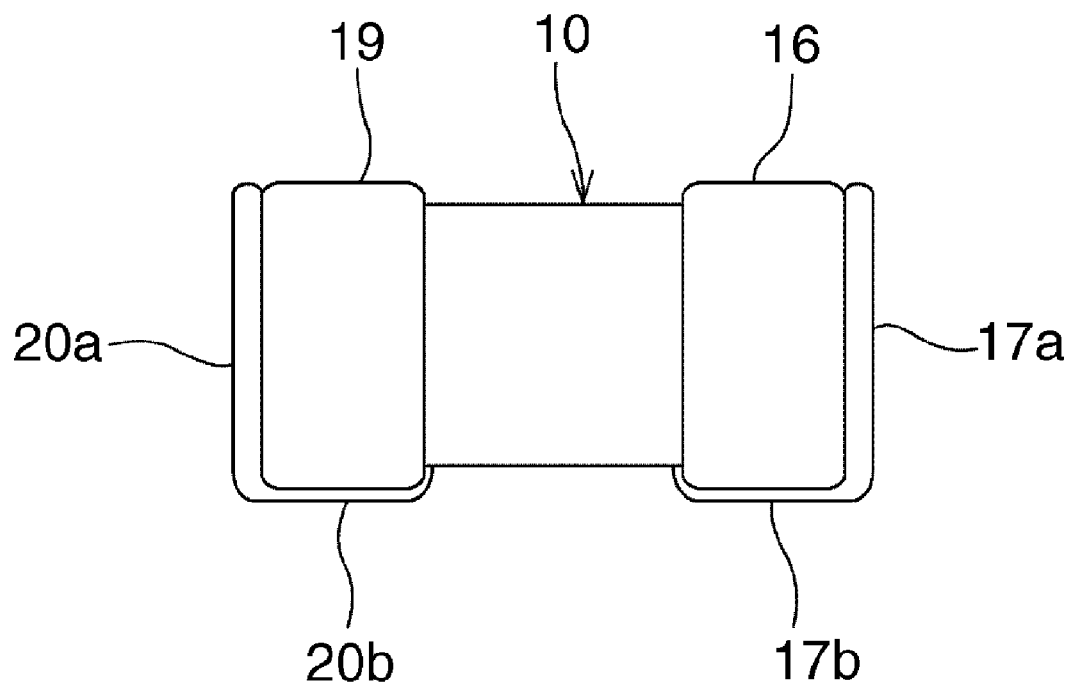
FIG. 13 is a schematic view showing the process of forming the second portion of the second conductive layer.

For example, the formation of the second conductive layers may be specifically performed in the following manner. First, as shown in FIG. 11, conductive paste 30 is applied to both of the end surfaces of the ceramic body (the electronic component body 10) on which the first conductive layers are formed by a dip method. Specifically, the ceramic body is dipped in the conductive paste 30 to apply the conductive paste 30 to both of the end surfaces of the ceramic body. Next, as shown in FIG. 12, the conductive paste 30 is applied to the first conductive layers located on the first side surface of the ceramic body by the dip method. Specifically, the first conductive layers located on the first side surface of the ceramic body are dipped in the conductive paste 30 to apply the conductive paste 30 to the first conductive layers. In this manner, the conductive paste is applied to both of the end surfaces and the first side surface of the ceramic body, as shown in FIG. 13. Similarly, the conductive paste is applied to the first conductive layers on the second side surface of the ceramic body by the dipping method. Then, the ceramic body is fired to complete the second conductive layers.

The first conductive layers and the second conductive layers may preferably be concurrently fired in the firing of the ceramic body.

Other preferred embodiments of the present invention will now be described. The same reference numerals are used in the following description of the preferred embodiments to identify the members having substantially the same functions as in the first preferred embodiment. A description of such members is omitted herein.

Second Preferred Embodiment

Figure 14:
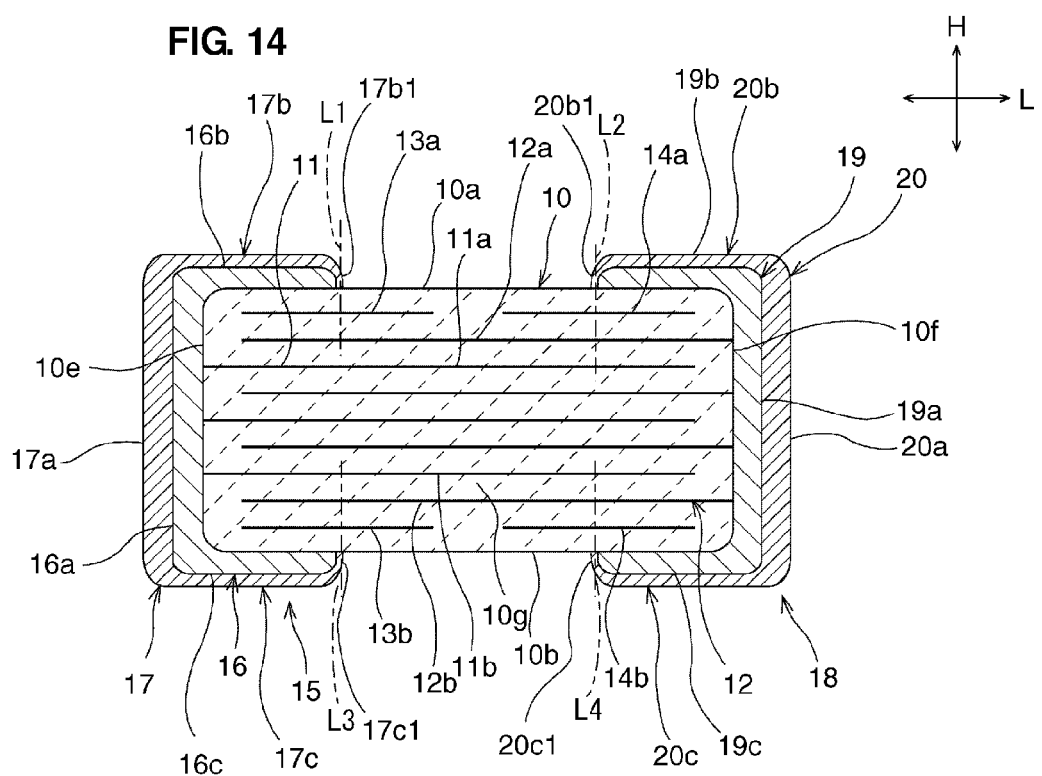
FIG. 14 is a schematic cross-sectional view of an electronic component according to a second preferred embodiment of the present invention.

The first to fourth inner conductors 13a, 14a, 13b, and 14b are preferably connected to the first outer electrode 15 or the second outer electrode 18 in the above first preferred embodiment. However, the present invention is not limited to this structure. According to a second preferred embodiment of the present invention, the first to fourth inner conductors 13a, 14a, 13b, and 14b may preferably be connected to none of the first outer electrode 15 and the second outer electrode 18, as shown in FIG. 14. With this configuration, an occurrence of the migration of Ag can be prevented, as in the first preferred embodiment. Accordingly, it is possible to prevent an occurrence of short circuit failure.

Third Preferred Embodiment

Figure 15:
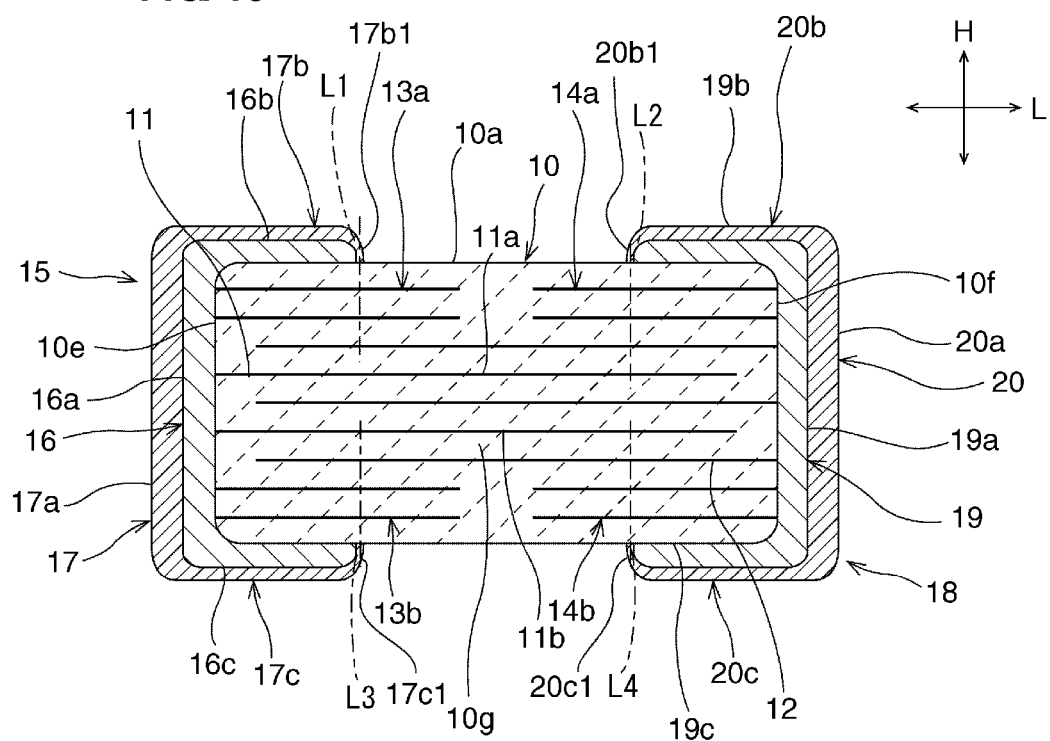
FIG. 15 is a schematic cross-sectional view of an electronic component according to a third preferred embodiment of the present invention.

One first inner conductor 13a, one second inner conductor 14a, one third inner conductor 13b, and one fourth inner conductor 14b are preferably provided in the above first preferred embodiment. However, the present invention is not limited to this structure. According to a third preferred embodiment of the present invention, multiple first inner conductors 13a, multiple second inner conductors 14a, multiple third inner conductors 13b, and multiple fourth inner conductors 14b may preferably be provided along the vertical direction. For example, as shown in FIG. 15, two first inner conductors 13a, two second inner conductors 14a, two third inner conductors 13b, and two fourth inner conductor 14b may be arranged along the vertical direction. The provision of the multiple first inner conductors 13a, the multiple second inner conductors 14a, the multiple third inner conductors 13b, and the multiple fourth inner conductors 14b along the vertical direction H allows an occurrence of the migration of Ag to be more effectively prevented.

Also when the multiple first inner conductors 13a, the multiple second inner conductors 14a, the multiple third inner conductors 13b, and the multiple fourth inner conductors 14b are provided, the first inner conductors 13a and the third inner conductor 13b may be connected to the first outer electrode 15 and the second inner conductor 14a and the fourth inner conductors 14b may be connected to the second outer electrode 18 or may be connected to none of the first and second outer electrodes 15 and 18.

Fourth Preferred Embodiment

Figure 16:
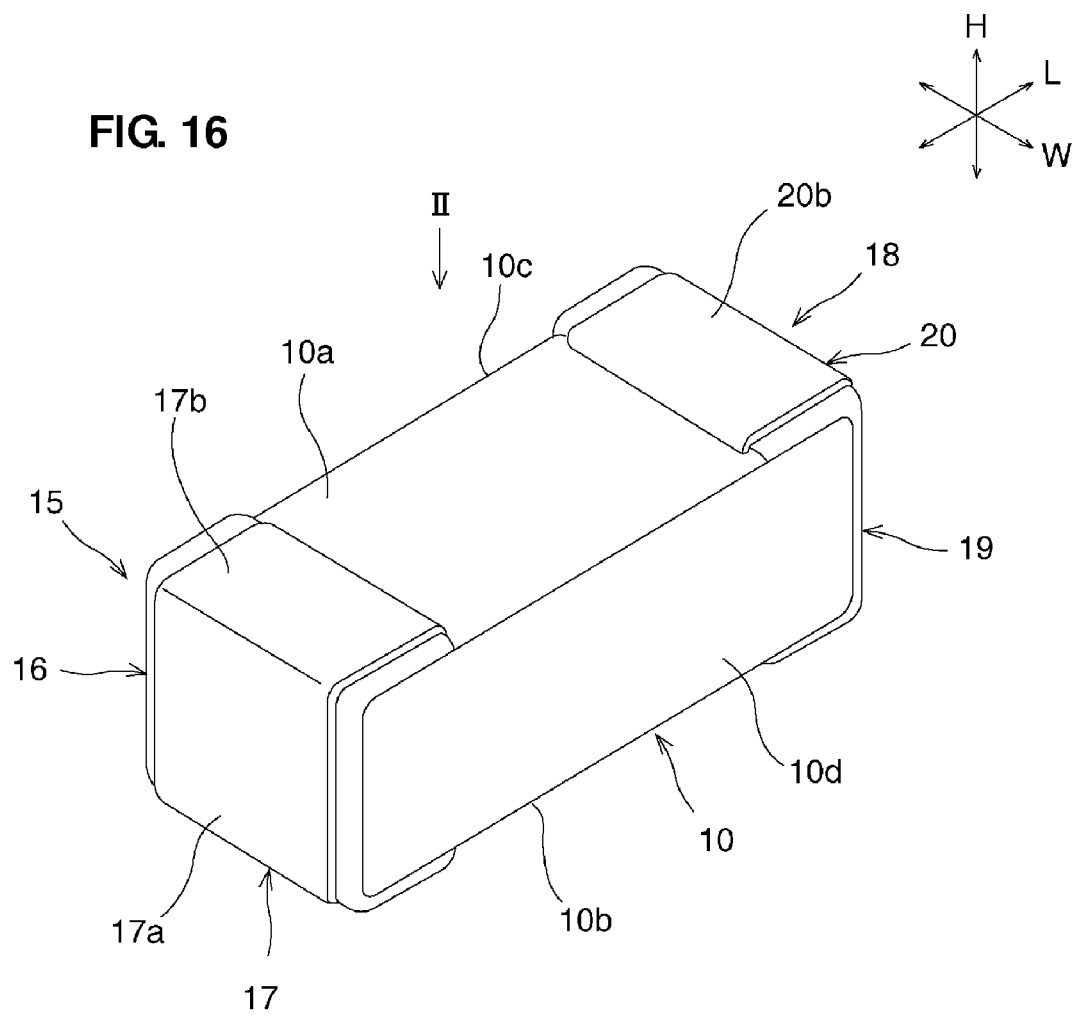
FIG. 16 is a schematic perspective view of an electronic component according to a fourth preferred embodiment of the present invention.

Portions of the first side surface 10c and the second side surface 10d of the electronic component body 10 are preferably covered with the first conductive layers 16 and 19 in the first preferred embodiment. However, the present invention is not limited to this structure. According to a fourth preferred embodiment of the present invention, the first conductive layers 16 and 19 may preferably not be provided on the first and second side surfaces 10c and 10d, as shown in FIG. 16. Specifically, the fourth portions 16d and 19d and the fifth portions 16e and 19e of the first conductive layers 16 and 19, with which portion of the first and second side surfaces 10c and 10d is covered (refer to FIG. 2), may not be provided. In other words, only the first to third portions 16a, 16b, and 16c may preferably include the first conductive layer 16 and only the first to third portions 19a, 19b, and 19c may compose the first conductive layer 19.

Fifth Preferred Embodiment

Figure 17:
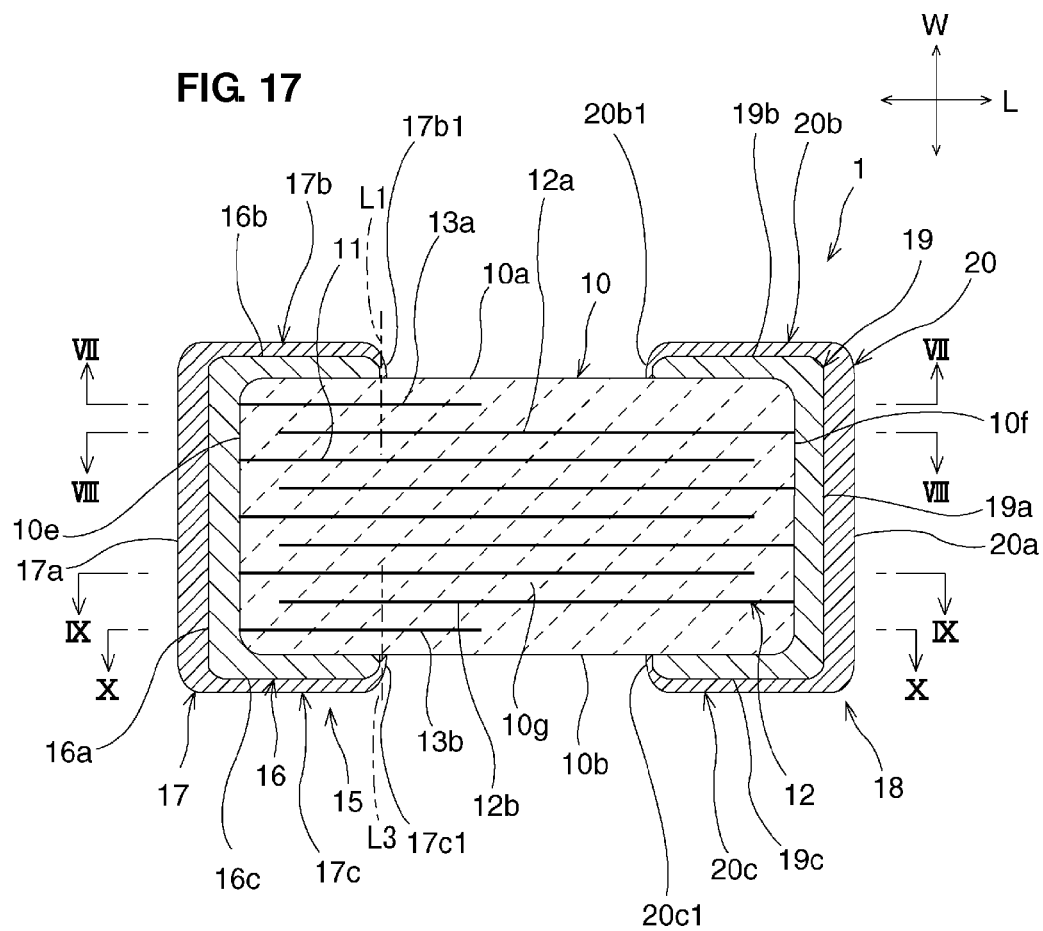
FIG. 17 is a schematic cross-sectional view of an electronic component according to a fifth preferred embodiment of the present invention.

The second and fourth inner conductors 14a and 14b are provided along with the first and third inner conductors 13a and 13b in the first preferred embodiment. However, if the inner electrode closest to the second contact portion 20b1 is the second inner electrode 12a connected to the second outer electrode 18 as in a case shown in FIG. 17 according to a fifth preferred embodiment of the present invention, the second inner conductor 14a may not necessarily be provided. If the inner electrode closest to the fourth contact portion 20c1 is the second inner electrode 12b connected to the second outer electrode 18 as in the case shown in FIG. 17 according to the fifth preferred embodiment of the present invention, the fourth inner conductor 14b may not necessarily be provided.

Sixth Preferred Embodiment

The second conductive layer 17 is preferably not disposed on the fourth and fifth portions 16d and 16e of the first conductive layers 16, positioned on the first and second side surfaces 10c and 10d of the electronic component body 10, and the second conductive layer 20 is preferably not disposed on the fourth and fifth portions 19d and 19e of the first conductive layer 19, positioned on the first and second side surfaces 10c and 10d of the electronic component body 10 in the first preferred embodiment. However, the present invention is not limited to this structure. For example, according to a sixth preferred embodiment of the present invention, the second conductive layer 17 may preferably be disposed on the fourth and fifth portions 16d and 16e of the first conductive layer 16 and the second conductive layer 20 may preferably be disposed on the fourth and fifth portions 19d and 19e of the first conductive layer 19. However, in this case, it is preferable that the second conductive layers 17 and 20 not be directly in contact with the first and second side surfaces 10c and 10d in order to prevent an occurrence of the migration of Ag. Specifically, it is preferable that only at least a portion of the fourth and fifth portions 16d and 16e, excluding the tips of the fourth and fifth portions 16d and 16e, be covered with the second conductive layer 17 and that only at least a portion of the fourth and fifth portions 19d and 19e, excluding the tips of the fourth and fifth portions 19d and 19e, be covered with the second conductive layer 20. In other words, it is preferable that the tips of the fourth and fifth portions 16d and 16e not be covered with the second conductive layer 17 and that the tips of the fourth and fifth portions 19d and 19e not be covered with the second conductive layer 20.

Seventh Preferred Embodiment

An electronic component 2 according to a seventh preferred embodiment of the present invention, shown in FIGS. 18 to 21, differs from the electronic component 1 according to the first preferred embodiment only in that the first to fourth inner conductors 13a, 14a, 13b, and 14b are not provided and in the structure of the second conductive layers 17 and 20.

According to the seventh preferred embodiment, as shown in FIGS. 18 to 21, the second conductive layers 17 and 20 are positioned only on the first conductive layers 16 and 19 and are not directly in contact with the first and second main surfaces 10a and 10b and the first and second side surfaces 10c and 10d of the electronic component body 10.

Figure 18:
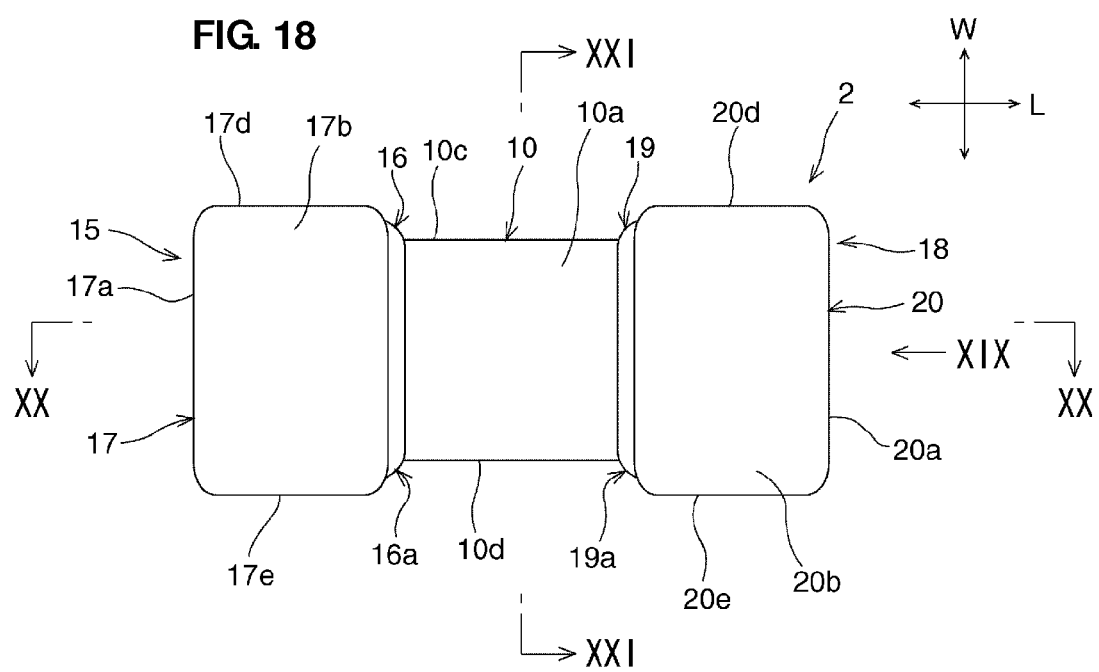
FIG. 18 is a schematic plan view of an electronic component according to a sixth preferred embodiment of the present invention.
Figure 19:
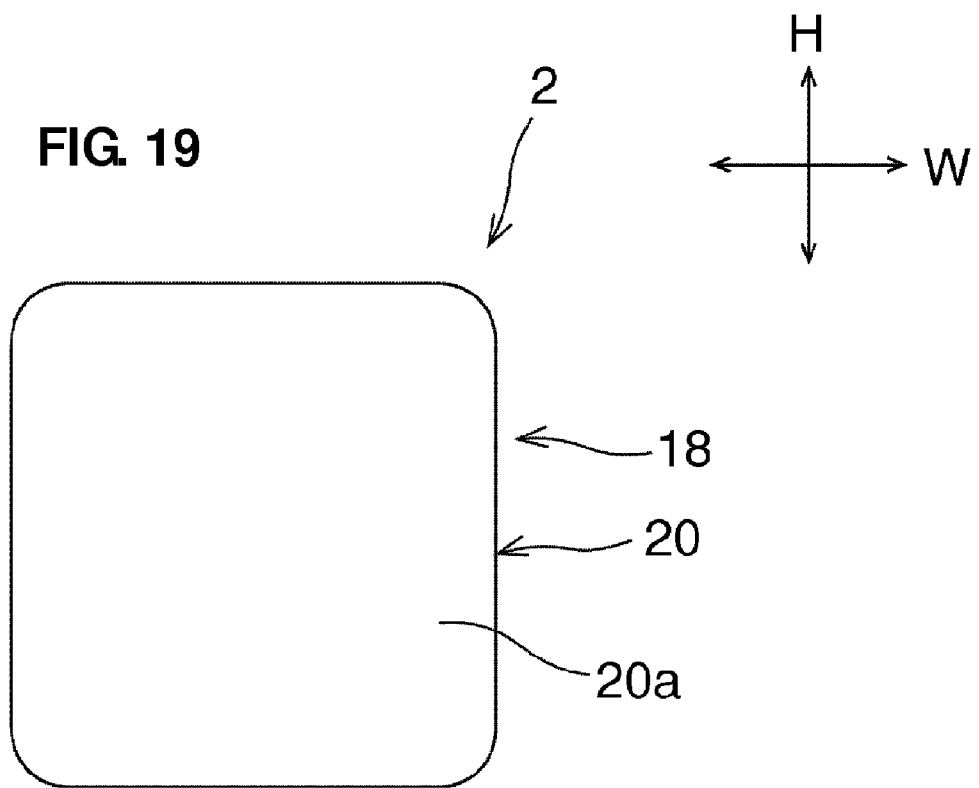
FIG. 19 is a schematic front view of the electronic component, viewed from an arrow XIX in FIG. 18.
Figure 20:
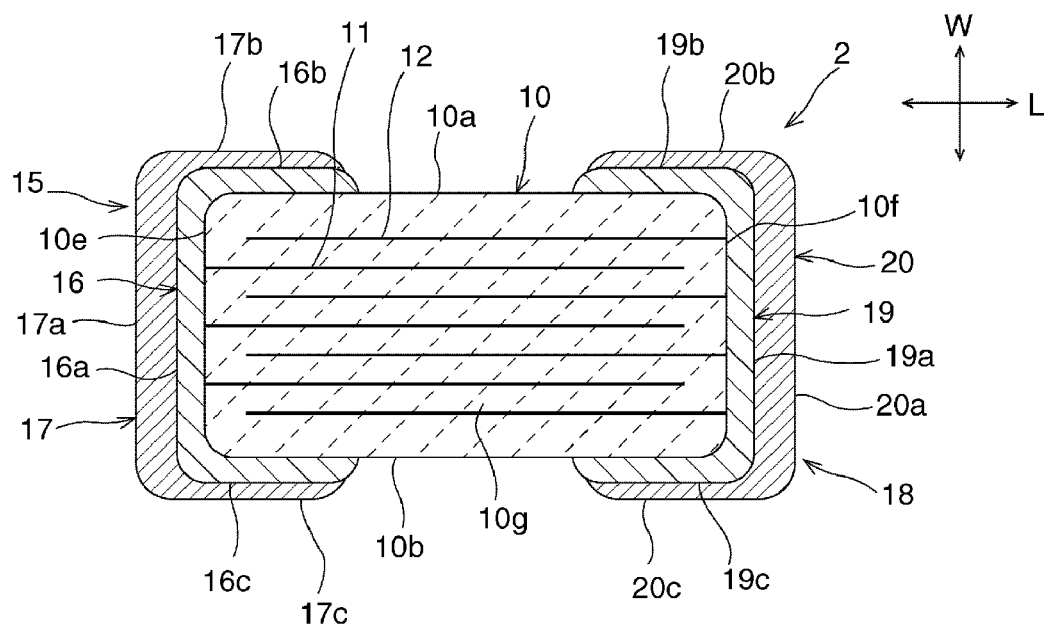
FIG. 20 is a schematic cross-sectional view of the electronic component, taken along a line XX-XX in FIG. 18.

Specifically, the second conductive layer 17 defining a portion of the first outer electrode 15 preferably includes a first portion 17a (refer to FIGS. 18 to 20), a second portion 17b (refer to FIG. 20), a third portion 17c (refer to FIG. 20), a fourth portion 17d (refer to FIG. 18), and a fifth portion 17e (refer to FIG. 18). As shown in FIGS. 18 to 20, the first portion 17a is positioned on the first portion 16a of the first conductive layer 16 disposed on the first end surface 10e. The portion of the first portion 16a excluding the tip thereof is covered with the first portion 17a. As shown in FIG. 20, the second portion 17b is positioned on the second portion 16b of the first conductive layer 16 disposed on the first main surface 10a. The portion of the second portion 16b excluding the tip thereof is covered with the second portion 17b. The third portion 17c is positioned on the third portion 16c of the first conductive layer 16 disposed on the second main surface 10b. The portion of the third portion 16c excluding the tip thereof is covered with the third portion 17c. The fourth portion 17d is positioned on the fourth portion 16d of the first conductive layer 16 disposed on the first side surface 10c. The portion of the fourth portion 16d excluding the tip thereof is covered with the fourth portion 17d. The fifth portion 17e is positioned on the fifth portion 16e of the first conductive layer 16 disposed on the second side surface 10d. The portion of the fifth portion 16e excluding the tip thereof is covered with the fifth portion 17e.

Figure 21:
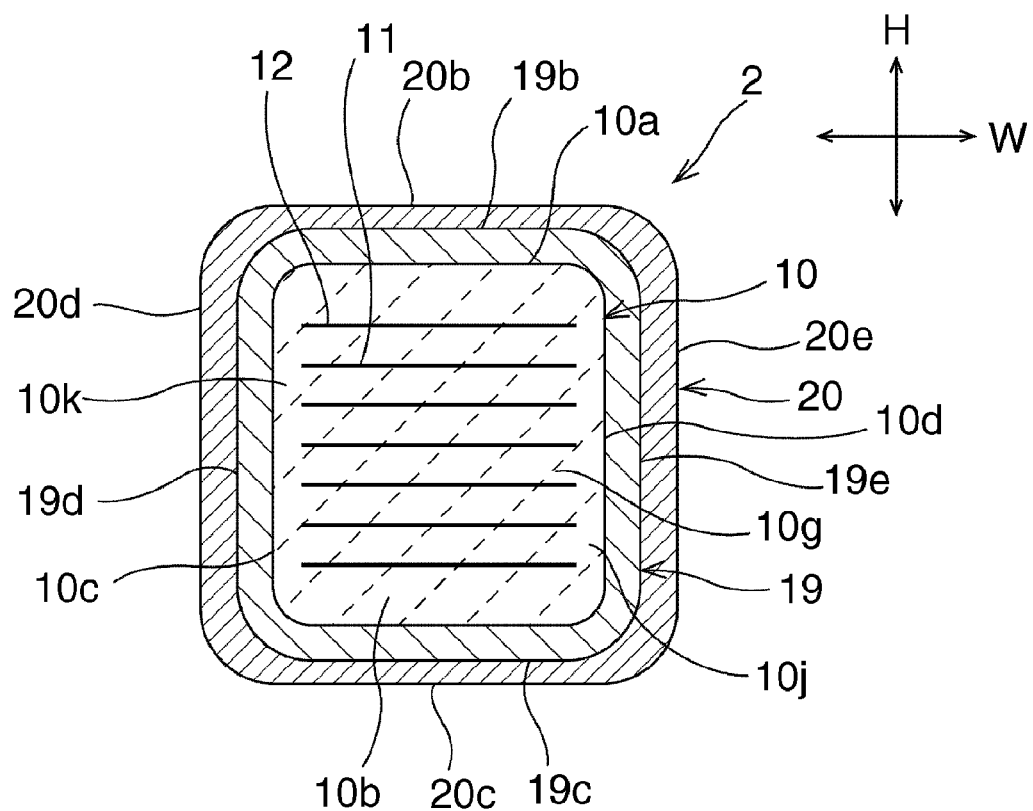
FIG. 21 is a schematic cross-sectional view of the electronic component, taken along a line XXI-XXI in FIG. 18.

The second conductive layer 20 defining a portion of the second outer electrode 18 preferably includes a first portion 20a (refer to FIGS. 18 to 20), a second portion 20b (refer to FIG. 20), a third portion 20c (refer to FIG. 20), a fourth portion 20d (refer to FIG. 21), and a fifth portion 20e (refer to FIG. 21). As shown in FIGS. 18 to 20, the first portion 20a is positioned on the first portion 19a of the first conductive layer 19 disposed on the second end surface 10f. The portion of the first portion 19a excluding the tip thereof is covered with the first portion 20a. As shown in FIG. 20, the second portion 20b is positioned on the second portion 19b of the first conductive layer 19 disposed on the first main surface 10a. The portion of the second portion 19b excluding the tip thereof is covered with the second portion 20b. The third portion 20c is positioned on the third portion 19c of the first conductive layer 19 disposed on the second main surface 10b. The portion of the third portion 19c excluding the tip thereof is covered with the third portion 20c. As shown in FIG. 21, the fourth portion 20d is positioned on the fourth portion 19*d* of the first conductive layer 19 disposed on the first side surface 10*c*. The portion of the fourth portion 19*d* excluding the tip thereof is covered with the fourth portion 20*d*. The fifth portion 20*e* is positioned on the fifth portion 19*e* of the first conductive layer 19 disposed on the second side surface 10*d*. The portion of the fifth portion 19*e* excluding the tip thereof is covered with the fifth portion 20*e*.

As described above, since the second conductive layers 17 and 20 are not directly in contact with the surface of the electronic component body 10 in the seventh preferred embodiment, an occurrence of the migration of Ag from the second conductive layers 17 and 20 to the electronic component body 10 can be effectively prevented even without the first to fourth inner conductors 13*a*, 14*a*, 13*b*, and 14*b*. Accordingly, it is possible to effectively prevent an occurrence of short circuit failure.

In addition, since there is no need to form the first to fourth inner conductors 13*a*, 14*a*, 13*b*, and 14*b* in the seventh preferred embodiment, the manufacturing process of the electronic component 2 can be simplified. Furthermore, the electronic component 2 can be reduced in height.

FIRST EXAMPLE

A total of 200 electronic components each having a shape similar to that in the above first preferred embodiment were manufactured in conditions described below (sample group A). The first and second outer electrodes were formed in the following manner. Cu paste of a thickness of about 60 µm was applied to both ends of a ceramic body subjected to firing, the ceramic body was dried, and the ceramic body was fired in a reducing atmosphere to form the first conductive layers. Then, after Ag—Pd paste of a thickness of about 80 µm was applied to the first conductive layers, Ag—Pd paste was added by using a plate jig, and solvent was dried, the ceramic body was fired in an oxidizing atmosphere to form the second conductive layers. The second conductive layers were directly in contact with none of the first and second side surfaces in the sample group A.

Dimensions of each electronic component: Length about 3.2 mm×Width about 1.6 mm×Height about 1.6 mm
Thickness of ceramic layer: about 15 µm
Ceramic layer: $BaTiO_3$
Distance from inner electrode closest to first main surface to first main surface and distance from inner electrode closest to second main surface to second main surface: about 100 µm
Dimensions of inner electrode: Length about 2.6 mm×Width about 1.0 mm×Thickness about 1.2 µm
Inner electrode: Ni A total of 200 samples (sample group B) were manufactured in the same manner as in the sample group A except that the first conductive layers were completely covered with the second conductive layers and portion of the second conductive layers was directly in contact with the first and second side surfaces.

Next, the sample groups A and B were mounted on alumina substrates having lands of dimensions recommended by Japanese Industrial Standards Committee (DISC) 6429 by using conductive adhesive. Specifically, 100 samples (sample group A1), among the total of 200 samples in the sample group A, were mounted on the alumina substrates by using the first main surface as the mounting surface and the remaining 100 samples (sample group A2) were mounted on the alumina subsequent by using the first side surface as the mounting surface. Similarly, 100 samples (sample group B1), among the total of 200 samples in the sample group B, were mounted on the alumina substrates by using the first main surface as the mounting surface and the remaining 100 samples (sample group B2) were mounted on the alumina subsequent by using the first side surface as the mounting surface.

Then, the sample groups A1, A2, B1, and B2 mounted on the alumina substrates were subjected to a high temperature of about 175° C. for about 500 hours in a state in which a direct-current (DC) voltage of about 75V was applied. After the sample groups A1, A2, B1, and B2 were subjected to the high temperature, it was visually confirmed whether the migration between the outer electrodes occurred. Table 1 shows the result of the visual confirmation.

TABLE 1

| Sample group | Mounting surface | Confirmed surface | The number of occurrences of migration/Total number of samples |
|---|---|---|---|
| A1 | First main surface | First main surface | 0/100 |
|  |  | Second main surface | 0/100 |
|  |  | First side surface | 0/100 |
|  |  | Second side surface | 0/100 |
| A2 | First side surface | First main surface | 0/100 |
|  |  | Second main surface | 0/100 |
|  |  | First side surface | 0/100 |
|  |  | Second side surface | 0/100 |
| B1 | First main surface | First main surface | 0/100 |
|  |  | Second main surface | 0/100 |
|  |  | First side surface | 9/100 |
|  |  | Second side surface | 15/100 |
| B2 | First side surface | First main surface | 0/100 |
|  |  | Second main surface | 0/100 |
|  |  | First side surface | 28/100 |
|  |  | Second side surface | 17/100 |

Table 1 shows that the migration of Ag occurred in none of the samples in the sample groups A1 and A2 in which the first to fourth inner conductors are arranged and the second conductive layers are not in contact with the first and second side surfaces. In contrast, the migration of Ag occurred in some of the samples in the sample groups B1 and B2 in which the first to fourth inner conductors are arranged and the second conductive layers are in contact with the first and second side surfaces. The results show that occurrences of the migration of Ag can be effectively prevented by arranging the first to fourth inner conductors and causing the second conductive layers not to be in contact with the first and second side surfaces.

In addition, no occurrence of the migration of Ag was also confirmed on the first and second main surfaces in the sample groups B1 and B2. This shows that an occurrence of the migration of Ag on the first and second main surfaces can be effectively prevented by arranging the first to fourth inner conductors.

Occurrences of the migration of Ag confirmed on the first and second side surfaces in the sample groups B1 and B2 could be due to the fact that Ag migrated from the portions where the first and second outer electrodes are in contact with the first and second side surfaces because the electric field concentrated between the portions where the first and second outer electrodes are in contact with the first and second side surfaces and the first and second inner electrodes.

In addition, the number of samples where occurrences of the migration of Ag were confirmed on the first and second side surfaces in the sample group B2 was greater than that in the sample group B1. This shows that the migration of Ag on the first and second side surfaces is particularly likely to occur when the first side surface is used as the mounting surface. In particular, many occurrences of the migration of Ag were observed on the first side surface in the sample group B2. This shows that the electric field concentrates on the mounting surface and the migration of Ag is particularly likely to occur on the mounting surface.

SECOND EXAMPLE

A total of 200 electronic components each having a shape similar to that in the above seventh preferred embodiment were manufactured in conditions described below (sample group C). The first and second outer electrodes were formed in the following manner. Cu paste of a thickness of about 60 μm was applied to both ends of a ceramic body subjected to firing, the ceramic body was dried, and the ceramic body was fired in a reducing atmosphere to form the first conductive layers. Then, after Ag—Pd paste of a thickness of about 50 μm was applied to the first conductive layers and solvent was dried, the ceramic body was fired in an oxidizing atmosphere to form the second conductive layers. The second conductive layers were directly in contact with none of the first and second main surfaces and the first and second side surfaces in the sample group C.
Dimensions of each electronic component: Length about 3.2 mm×Width about 1.6 mm×Height about 1.6 mm
Thickness of ceramic layer: about 15 μm
Ceramic layer: $BaTiO_3$
Distance from inner electrode closest to first main surface to first main surface and distance from inner electrode closest to second main surface to second main surface: about 100 μm
Dimensions of inner electrode: Length about 2.6 mm×Width about 1.0 mm×Thickness about 1.2 μm
Inner electrode: Ni A total of 200 samples (sample group D) were manufactured in the same manner as in the sample group C except that the first conductive layers were completely covered with the second conductive layers and portion of the second conductive layers was directly in contact with the first and second main surfaces and the first and second side surfaces.

Next, the sample groups C and D were mounted on alumina substrates having lands of dimensions recommended by JISC 6429 by using conductive adhesive. Specifically, 100 samples (sample group C1), among the total of 200 samples in the sample group C, were mounted on the alumina substrates using the first main surface as the mounting surface and the remaining 100 samples (sample group C2) were mounted on the alumina subsequent using the first side surface as the mounting surface. Similarly, 100 samples (sample group D1), among the total of 200 samples in the sample group D, were mounted on the alumina substrates using the first main surface as the mounting surface and the remaining 100 samples (sample group D2) were mounted on the alumina subsequent using the first side surface as the mounting surface.

Then, the sample groups C1, C2, D1, and D2 mounted on the alumina substrates were subjected to a high temperature of about 175° C. for about 500 hours in a state in which a DC voltage of about 75V was applied. After the sample groups C1, C2, D1, and D2 were subjected to the high temperature, it was visually confirmed whether the migration between the outer electrodes occurred. Table 2 shows the result of the visual confirmation.

TABLE 2

| Sample group | Mounting surface | Confirmed surface | The number of occurrences of migration/Total number of samples |
|---|---|---|---|
| C1 | First main surface | First main surface | 0/100 |
| | | Second main surface | 0/100 |
| | | First side surface | 0/100 |
| | | Second side surface | 0/100 |
| C2 | First side surface | First main surface | 0/100 |
| | | Second main surface | 0/100 |
| | | First side surface | 0/100 |
| | | Second side surface | 0/100 |
| D1 | First main surface | First main surface | 75/100 |
| | | Second main surface | 63/100 |
| | | First side surface | 12/100 |
| | | Second side surface | 18/100 |
| D2 | First side surface | First main surface | 71/100 |
| | | Second main surface | 59/100 |
| | | First side surface | 32/100 |
| | | Second side surface | 21/100 |

Table 2 shows that the migration of Ag occurred in none of the samples in the sample groups C1 and C2 in which the second conductive layers are not directly in contact with the first and second main surfaces and the first and second side surfaces. In contrast, the migration of Ag occurred in the samples in the sample groups D1 and D2 in which the second conductive layers are in contact with the first and second main surfaces and the first and second side surfaces. The results show that occurrences of the migration of Ag can be effectively prevented by causing the second conductive layers not to be directly in contact with the first and second main surfaces and the first and second side surfaces.

In addition, a comparison between the results of the sample groups A1, A2, B1, and B2 shown in Table 1 and the results of the sample groups C1, C2, D1, and D2 shown in Table 2 shows that the first to fourth inner conductors allow occurrences of the migration of Ag on the first and second main surfaces to be effectively prevented even when the second conductive layers are directly in contact with the first and second main surfaces.

In the sample group D1, many occurrences of the migration of Ag were confirmed on the first and second main surfaces and, particularly, the number of occurrences of the migration of Ag on the first main surface was large. Also in the sample group D2, as in the sample group D1, many occurrences of the migration of Ag were confirmed on the first and second main surfaces and, particularly, the number of occurrences of the migration of Ag on the first main surface was large. This could be due to the fact that the electric field is concentrated in wide areas on the first and second main surfaces because the area in which the portions where the second conductive layers are directly in contact with the first and second main surfaces are opposed to the inner electrodes was wider than the area in which the portions where the second conductive layers are directly in contact with the first and second side surfaces are opposed to the inner electrodes. In addition, the number of occurrences of the migration of Ag on the first main surface was greater than that on the second main surface. This could be due to the fact that a stronger electric field was applied to the first main surface because the first main surface was used as the mounting surface.

Furthermore, the number of occurrences of the migration of Ag on the first side surface in the sample group D2 was greater than that in the sample group D1. This could be due to the fact that the electric field applied to the first side surface in the sample group D2 in which the first side surface was used as the mounting surface was stronger than that in the sample group D1 in which the first main surface was used as the mounting surface.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an electronic component body having a substantially rectangular parallelepiped shape and including first and second main surfaces extending along a lateral direction and a longitudinal direction, first and second side surfaces extending along the longitudinal direction and a vertical direction, and first and second end surfaces extending along the lateral direction and the vertical direction;
   a first outer electrode arranged so that the first end surface, a portion of the first main surface, and a portion of the first and second side surfaces are covered with the first outer electrode;
   a second outer electrode provided on the second end surface;
   a first inner electrode arranged in the electronic component body and being connected to the first outer electrode; and
   a second inner electrode arranged in the electronic component body and being connected to the second outer electrode; wherein
   the first outer electrode includes a first conductive layer that is arranged so that the first end surface, a portion of the first main surface, and a portion of the first and second side surfaces are covered with the first conductive layer and that does not include silver and a second conductive layer that is disposed on the first conductive layer so as to be positioned at an outermost layer and that includes silver;
   the second conductive layer includes a first contact portion that is in contact with the first main surface and the second conductive layer is not in contact with the first and second side surfaces;
   among the first and second inner electrodes, the inner electrode closest to the first contact portion is the second inner electrode, and the electronic component further includes a first inner conductor positioned on a virtual straight or substantially straight line connecting the second inner electrode and the first contact portion in the shortest distance; and
   the first inner conductor is connected only to the first outer electrode, among the first and second outer electrodes, or is connected to none of the first and second outer electrodes.

2. The electronic component according to claim 1, wherein
   the second outer electrode is arranged so that the second end surface, a portion of the first main surface, and a portion of the first and second side surfaces are covered with the second outer electrode;
   the second outer electrode includes a first conductive layer that is arranged so that the second end surface, a portion of the first main surface, and a portion of the first and second side surfaces are covered with the first conductive layer and that does not include silver and a second conductive layer that is disposed on the first conductive layer so as to be positioned at an outermost layer and that includes silver;
   the second conductive layer of the second outer electrode includes a second contact portion that is in contact with the first main surface and the second conductive layer of the second outer electrode is not in contact with the first and second side surfaces;
   a second inner conductor is provided on a virtual straight or substantially straight line connecting the first inner electrode closest to the second contact portion and the second contact portion in the shortest distance or the second inner electrode is positioned on the virtual straight or substantially straight line connecting the first inner electrode closest to the second contact portion and the second contact portion in the shortest distance; and
   the second inner conductor is connected only to the second outer electrode, among the first and second outer electrodes, or is connected to none of the first and second outer electrodes.

3. The electronic component according to claim 1, wherein a portion of the first conductive layer that is positioned on the first and second side surfaces is not covered with the second conductive layer.

4. The electronic component according to claim 1, wherein only at least a portion of a portion of the first conductive layer that is positioned on the first side surface is covered with the second conductive layer and only at least portion of a portion of the first conductive layer that is positioned on the second side surface is covered with the second conductive layer, and a tip in the longitudinal direction is not included in each of the portions of the first conductive layer.

5. The electronic component according to claim 1, wherein a plurality of first inner conductors are provided.

6. An electronic component comprising:
   an electronic component body having a substantially rectangular parallelepiped shape and including first and second main surfaces extending along a lateral direction and a longitudinal direction, first and second side surfaces extending along the longitudinal direction and a vertical direction, and first and second end surfaces extending along the lateral direction and the vertical direction;

a first outer electrode arranged so that the first end surface, a portion of the first main surface, and a portion of the first and second side surfaces are covered with the first outer electrode;

a second outer electrode arranged so that the second end surface, a portion of the first main surface, and a portion of the first and second side surfaces are covered with the second outer electrode;

a first inner electrode arranged in the electronic component body and being connected to the first outer electrode; and a second inner electrode arranged in the electronic component body and being connected to the second outer electrode; wherein the first outer electrode includes a first conductive layer that is arranged so that the first end surface, a portion of the first main surface, and a portion of the first and second side surfaces are covered with the first conductive layer and that does not include silver, the second outer electrode includes a first conductive layer that is arranged so that the second end surface, a portion of the first main surface, and a portion of the first and second side surfaces are covered with the first conductive layer and that does not include silver, and each of the first and second outer electrodes includes a second conductive layer that is disposed on the first conductive layer so as to be positioned at an outermost layer and that includes silver; and the second conductive layer of the first outer electrode and the second conductive layer of the second outer electrode are positioned only on the first conductive layer and are not directly in contact with the first and second main surfaces and the first and second side surfaces.

7. The electronic component according to claim 1, wherein the second conductive layer includes silver or a silver-palladium alloy as a major component.

8. The electronic component according to claim 1, wherein the electronic component body is made of ceramics.

* * * * *